(12) United States Patent
Hasegawa

(10) Patent No.: US 8,572,839 B2
(45) Date of Patent: Nov. 5, 2013

(54) FABRICATION METHOD FOR MULTI-PIECE BOARD

(75) Inventor: Yasushi Hasegawa, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 1095 days.

(21) Appl. No.: 12/500,041

(22) Filed: Jul. 9, 2009

(65) Prior Publication Data

US 2010/0115766 A1 May 13, 2010

(30) Foreign Application Priority Data

Nov. 7, 2008 (JP) .................................. 2008-287213

(51) Int. Cl.
*H05K 3/20* (2006.01)

(52) U.S. Cl.
USPC ................... 29/831; 29/412; 29/464; 29/846

(58) Field of Classification Search
USPC .......... 29/830, 831, 846, 411, 412, 464, 467, 29/709–711, 721; 174/255; 361/801, 802
See application file for complete search history.

(56) References Cited

U.S. PATENT DOCUMENTS

| | | | |
|---|---|---|---|
| 5,866,852 A * | 2/1999 | Benz et al. | 174/255 |
| 7,451,768 B2 * | 11/2008 | Ku | 29/721 |

FOREIGN PATENT DOCUMENTS

| | | |
|---|---|---|
| JP | 7-335998 | 12/1995 |
| JP | 11-307905 | 11/1999 |
| JP | 2000-252605 | 9/2000 |
| JP | 2002-171034 | 6/2002 |
| JP | 2002-232089 | 8/2002 |
| JP | 2002-261436 | 9/2002 |
| JP | 2002-289986 | 10/2002 |
| JP | 2002-353572 | 12/2002 |
| JP | 2003-069190 | 3/2003 |
| JP | 2005-322878 | 11/2005 |
| JP | 2007-115855 | 5/2007 |
| TW | I228020 (B) | 2/2005 |

* cited by examiner

*Primary Examiner* — Donghai D. Nguyen
(74) *Attorney, Agent, or Firm* — Oblon, Spivak, McClelland, Maier & Neustadt, L.L.P.

(57) ABSTRACT

A fabrication method for a multi-piece board having a frame part and multi piece parts each having a printed wiring board includes producing the frame part having a first coupling portion, and the multi-piece parts including piece parts each having a second coupling portion coupled to the first coupling portion at a production panel with at least the frame part and the piece parts being separated from each other, separating the frame part and the multi-piece parts from the production panel, and coupling the first coupling portion to the second coupling portion to couple the frame part and the piece parts and combine the frame part and the multi piece parts so as to yield the multi-piece board.

18 Claims, 39 Drawing Sheets

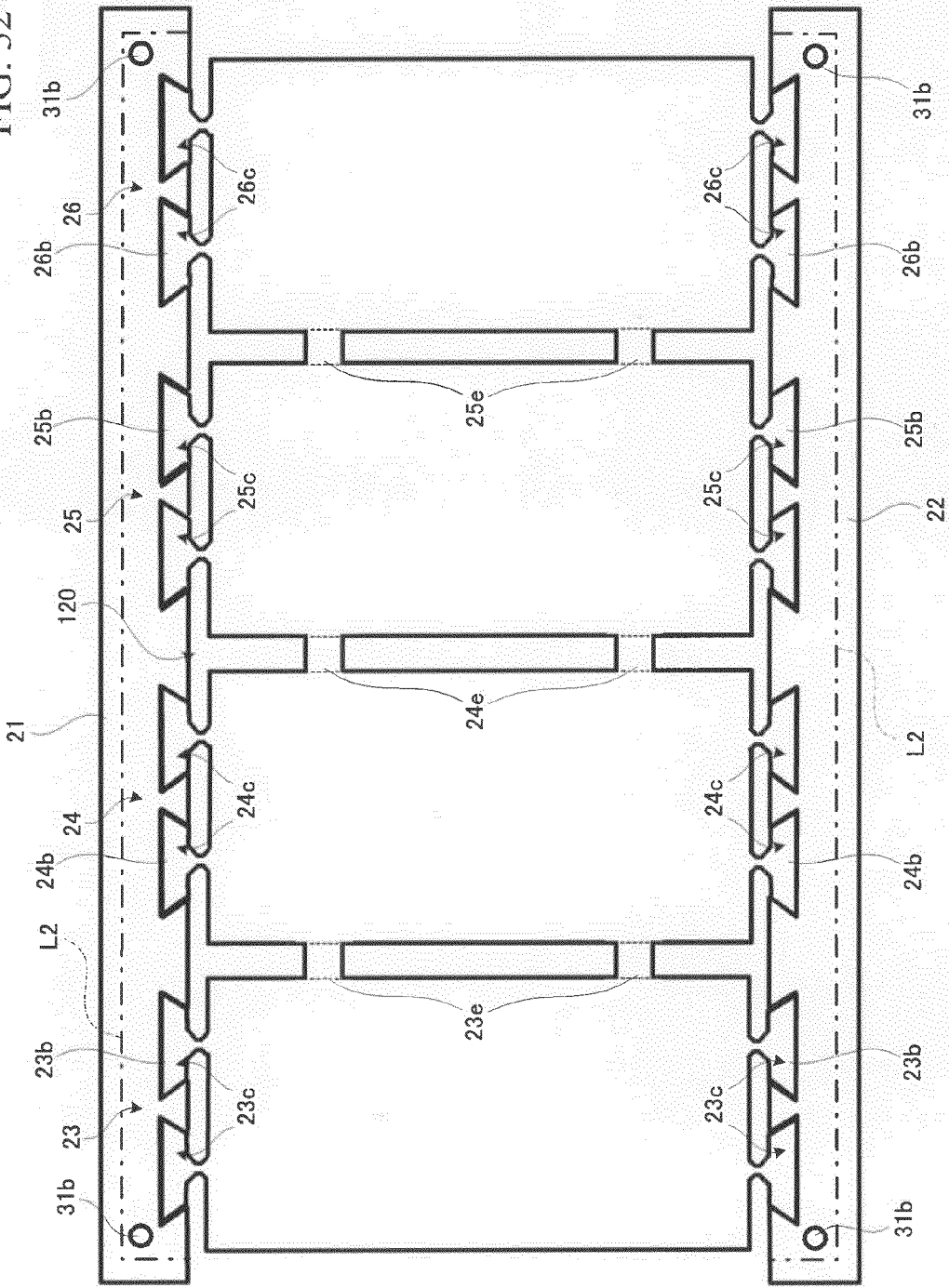

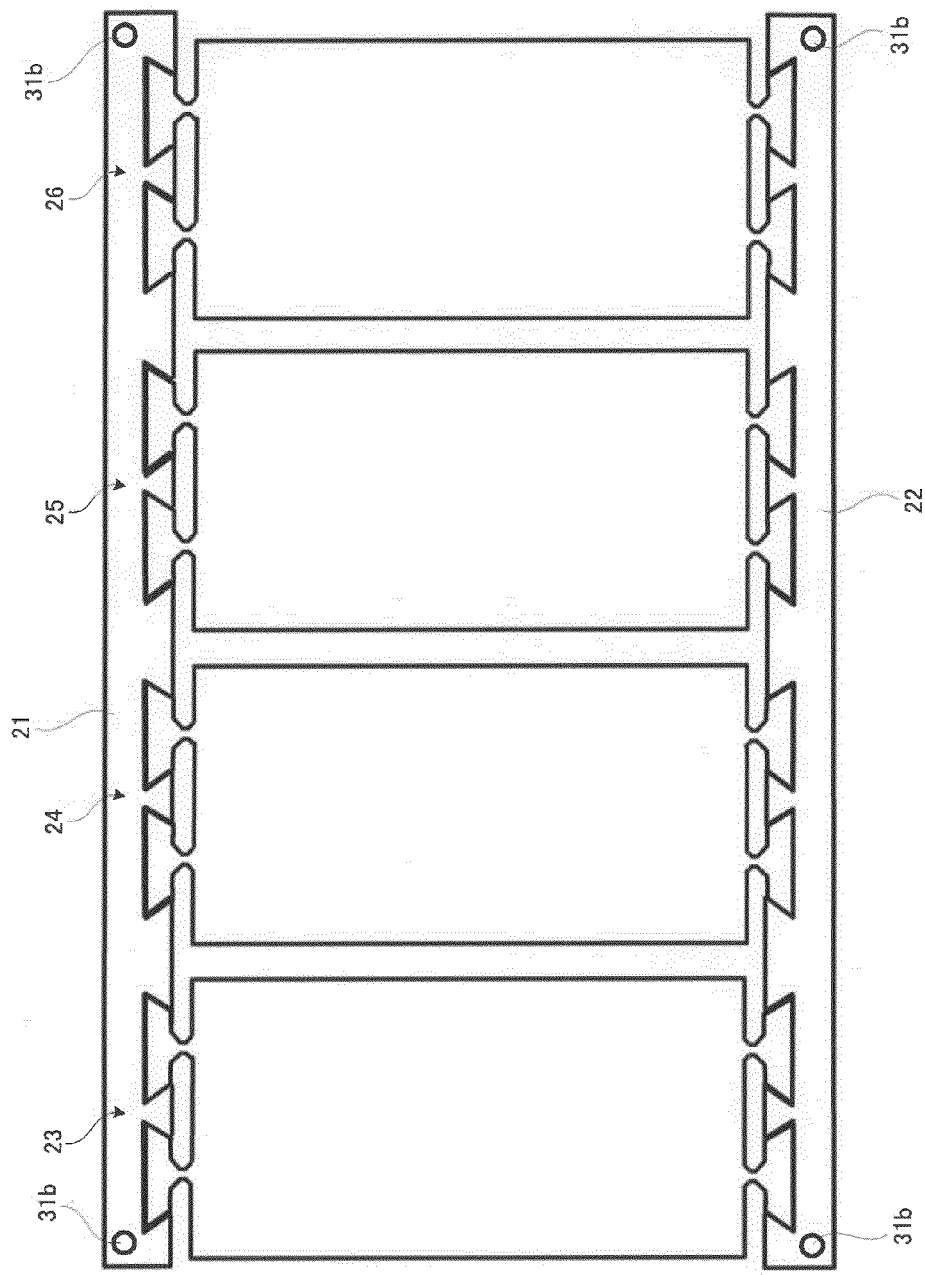

FABRICATION METHOD FOR MULTI-PIECE BOARD

CROSS REFERENCE TO RELATED APPLICATIONS

A priority right is claimed for the present application based on Japanese Patent Application No. 2008-287213, which was filed on Nov. 7, 2008. The entire contents of Japanese Patent Application No. 2008-287213 are herein incorporated by reference.

BACKGROUND OF THE INVENTION

1. Field of the Invention

The present invention relates to a method of fabricating a multi-piece board having a frame part as a coupling member and a multi-piece parts.

2. Descriptions of the Related Art

For example, Unexamined Japanese Patent Application Publication No. 2002-289986, Unexamined Japanese Patent Application Publication No. 2002-232089, Unexamined Japanese Patent Application Publication No. 2003-69190, Unexamined Japanese Patent Application Publication No. 2007-115855, and Unexamined Japanese Patent Application Publication No. 2005-322878 describe methods of fabricating multi-piece boards. Each of multi-piece boards has a frame part and a multi-piece parts connected to the frame part.

The contents of these publications are herein incorporated in their entirety.

SUMMARY OF INVENTION

According to one aspect of the invention, there is provided a fabrication method for a multi-piece board having a frame part and multi-piece parts each having a printed wiring board and connected to the frame part. The method includes producing the frame part having a first coupling portion, and the multi-piece parts including piece parts each having a second coupling portion, at a production panel with at least the frame part and the piece parts being separated from each other, separating the frame part and the multi-piece parts from the production panel, and combining the frame part and the piece parts by coupling the first coupling portion to the second coupling portion.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIG. 32 is a diagram for explaining a step of connecting the first frame part and a first coupled piece unit;

FIG. 33 is a diagram for explaining an outline processing step after the first frame part is connected to the first coupled piece unit;

DETAILED DESCRIPTIONS OF THE EMBODIMENTS

Figure 1:
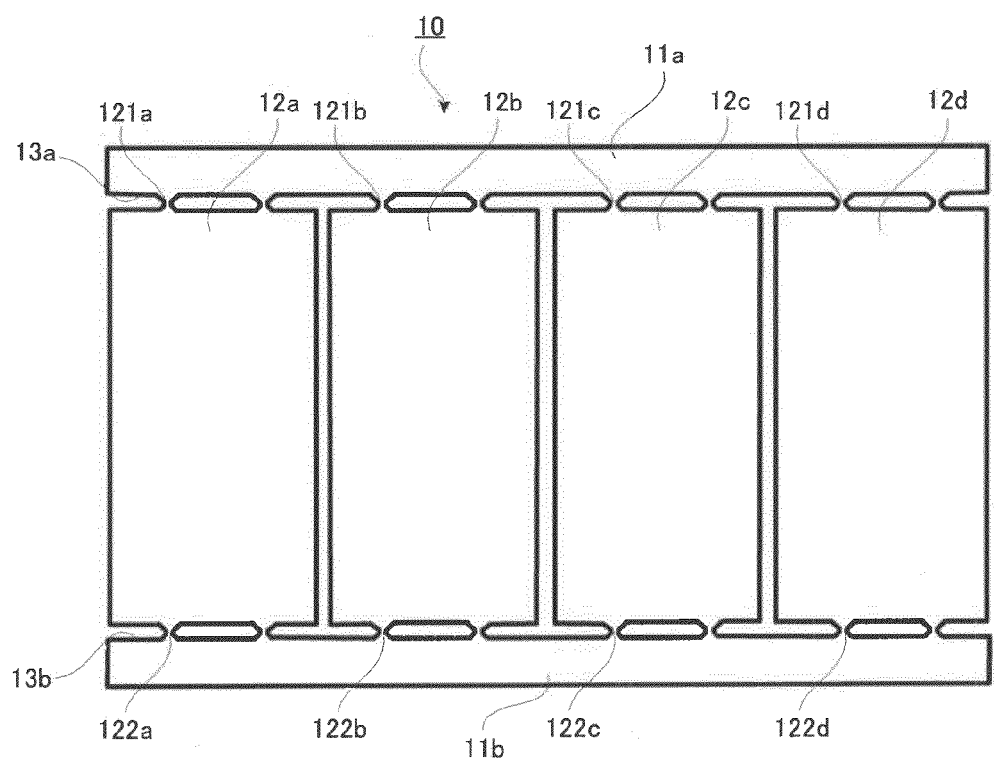
FIG. 1 is a plan view of a multi-piece board which is a target of a fabrication method for a multi-piece board according to a first embodiment of the present invention.

The embodiments will now be described with reference to the accompanying drawings, wherein like reference numerals designate corresponding or identical elements throughout the various drawings.

(First Embodiment)

As shown in FIG. 1, for example, a multi-piece board 10 which is to be fabricated according to the embodiment has frame parts 11a and 11b as joint portions, and piece parts 12a, 12b, 12c and 12d.

The frame parts 11a and 11b are two long bar-like parts sandwiching the successive piece parts 12a to 12d. The piece parts 12a to 12d are connected to one another via the frame parts 11a and 11b. It is to be noted that the shape of the frame parts 11a and 11b is optional, and may be, for example, a parallelogram, circular or elliptical frame surrounding the piece parts 12a to 12d. The frame parts 11a and 11b are formed of, for example, the same material as that for the piece parts 12a to 12d. The material is not however essential, and the frame parts 11a and 11b may be formed of a material different from the material for the piece parts 12a to 12d. For example, the frame parts 11a and 11b may be formed of an insulating material alone. The frame parts 11a and 11b are formed by, for example, a known photolithography technique or the like.

Each of the piece parts 12a to 12d is a printed wiring board. Specifically, each of the piece parts 12a to 12d is a rectangular rigid printed wiring board. The rigid printed wiring board includes circuits of an electronic device, for example. The piece parts 12a to 12d can be fabricated by laminating a prepreg impregnated with an uncured epoxy resin, polyimide resin or phenolic resin or the like on a base, such as a glass cloth, an unwoven cloth of aramid fibers, or paper, using a general fabrication method for, for example, a multilayer printed wiring board. It is to be however noted that the structure of the piece parts 12a to 12d is not limited to this particular type. Each of the piece parts 12a to 12d may be a printed wiring board acquired by alternately laminating a wiring layer and an insulation layer on, for example, a ceramic base. In addition, the shape of the piece parts 12a to 12d is optional, and may be, for example, a parallelogram, circular or elliptical shape.

Figure 2A:
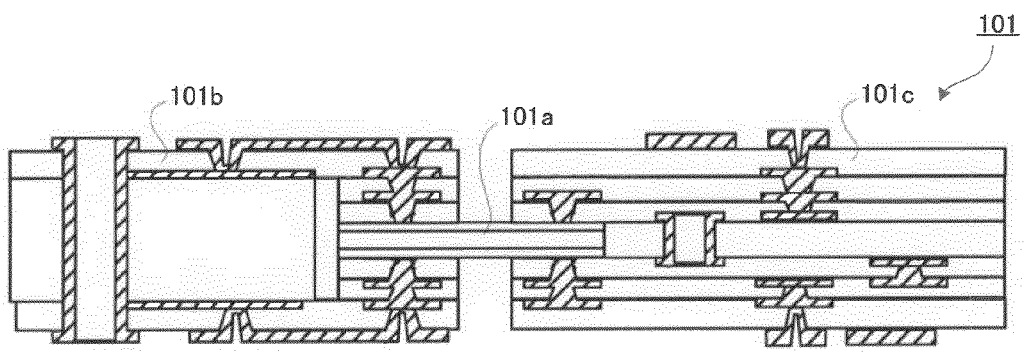
FIGS. 2A-2C are cross-sectional views showing one example of a piece part.
Figure 2B:
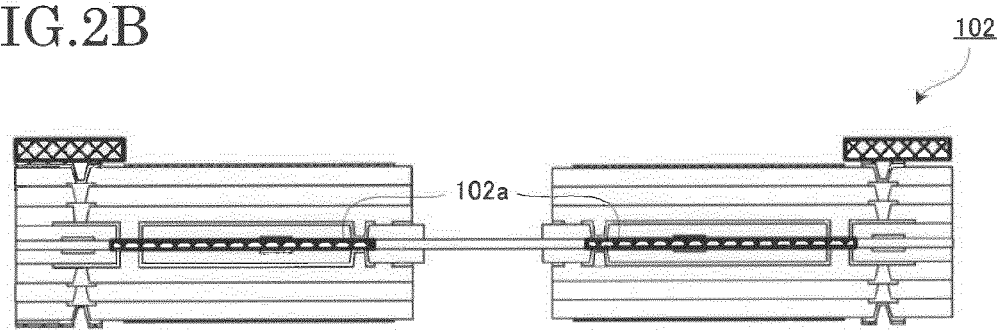
Figure 2C:
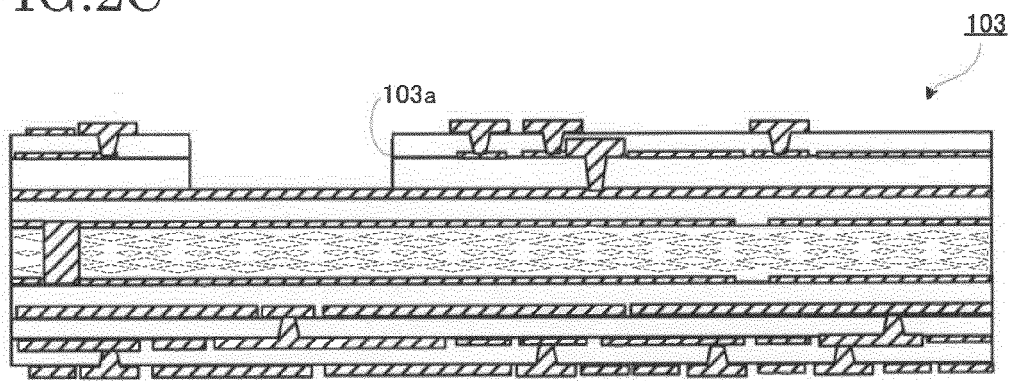
Figure 3A:
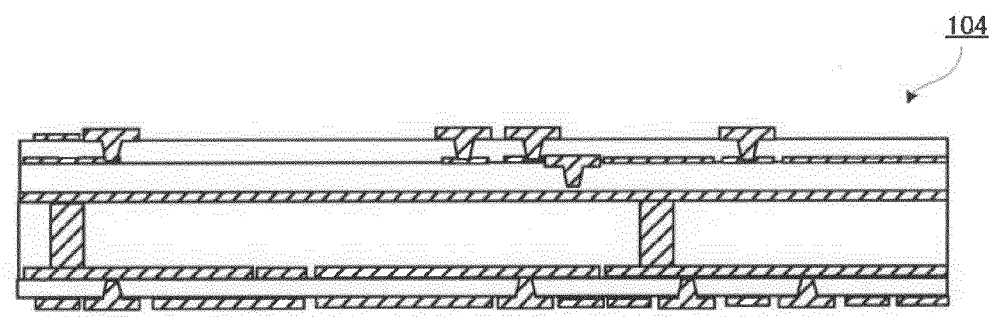
FIGS. 3A-3B are cross-sectional views showing one example of a piece part.
Figure 3B:
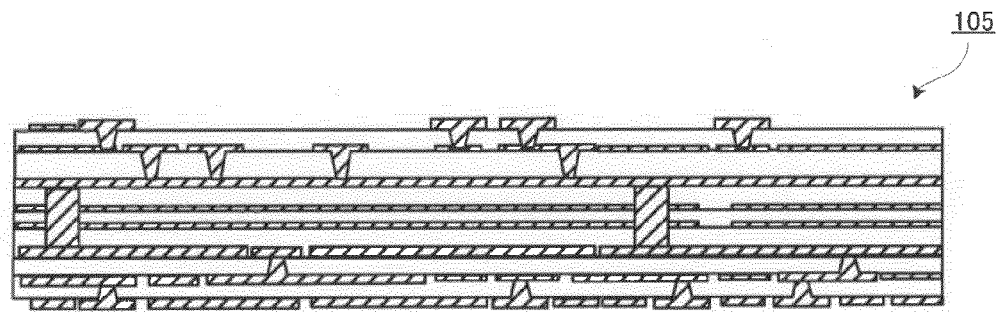

The piece parts 12a to 12d are not limited to a rigid printed wiring board. For example, each piece part may be a flex-rigid printed wiring board. For example, as shown in FIG. 2A, each piece part may be a flex-rigid printed wiring board 101 having a flexible portion 101a, and rigid portions 101b and 101c. In addition, as shown in FIG. 2B, for example, each piece part may be a printed wiring board 102 having an electronic part 102a built therein. Further, as shown in FIG. 2C, for example, each piece part may be a printed wiring board 103 having a cavity 103a formed in the top surface thereof. Those different types of printed wiring boards may be arbitrarily combined on a single multi-piece board 10. Further, in the combination of different types of printed wiring boards or the combination of printed wiring boards of the same type, a low-density printed wiring board 104 as shown in FIG. 3A, for example, and a high-density printed wiring board 105 as shown in FIG. 3B, for example, may be combined. The low-density printed wiring board is a printed wiring board having a lower wiring density than the high-density printed wiring board.

Slits 13a and 13b are formed between the frame parts 11a, 11b and the piece parts 12a to 12d, excluding those portions of bridges 121a to 121d and 122a to 122d as shown in FIG. 1. That is, the frame part 11a is connected to the piece parts 12a, 12b, 12c and 12d via the bridges 121a, 121b, 121c and 121d, respectively, and the frame part 11b is connected to the piece parts 12a, 12b, 12c and 12d via the bridges 122a, 122b, 122c and 122d, respectively.

Figure 4:
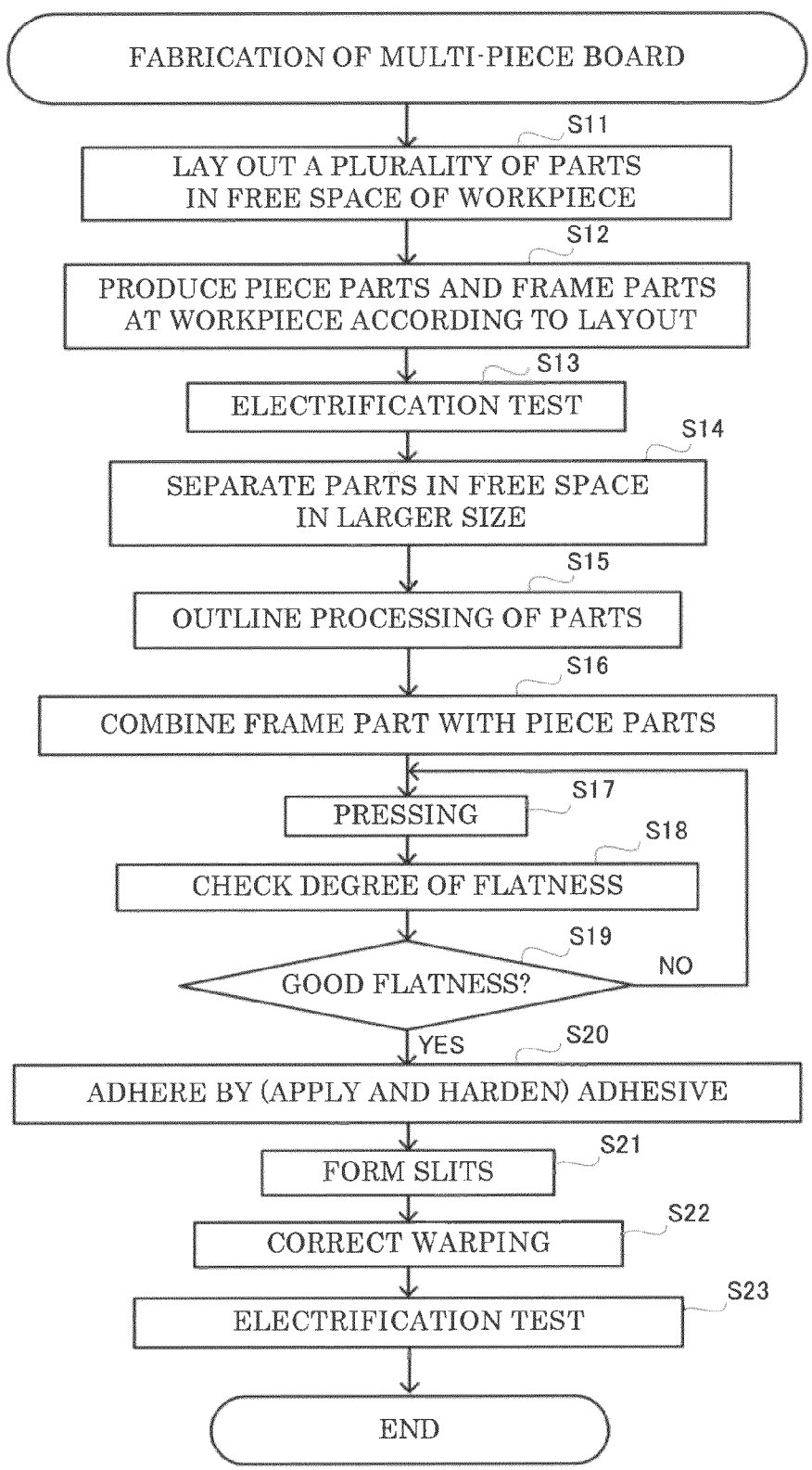
FIG. 4 is a flowchart illustrating procedures of the fabrication method for a multi-piece board according to the first embodiment of the invention.

In case of fabricating the multi-piece board 10, for example, the worker carries out a series of processes illustrated in FIG. 4.

Figure 5:
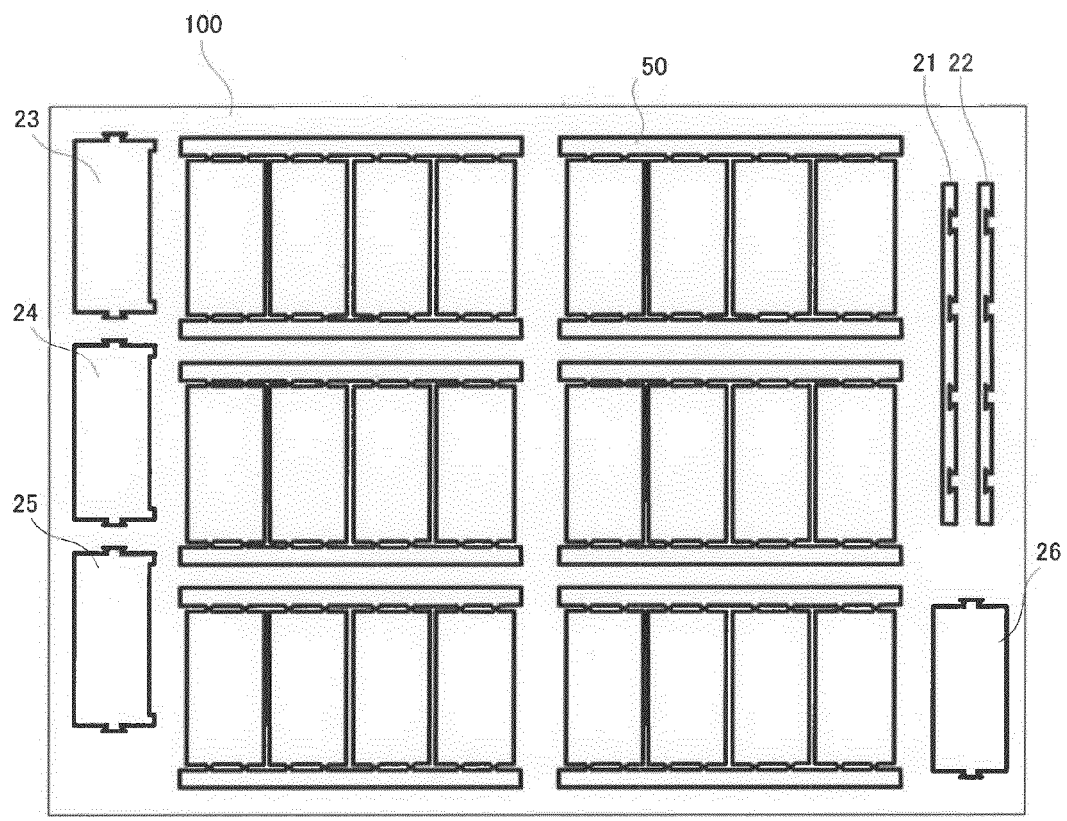
FIG. 5 is a diagram showing an example of the layout of parts of multi-piece boards.

First, in step S11 the worker separates a multi-piece board 10 to be fabricated into multiple parts, namely, a first part 21, a second part 22, a third part 23, a fourth part 24, a fifth part 25 and a sixth part 26, and lays out the first to sixth parts 21 to 26 in free space (extra area) of a production panel 100 for fabricating another multi-piece board 50, as shown in FIG. 5. The first part 21 and the second part 22 approximately correspond to the frame parts 11a and 11b, respectively, whereas the third part 23, the fourth part 24, the fifth part 25 and the sixth part 26 approximately correspond to the piece parts 12a, 12b, 12c and 12d, respectively.

Subsequently, in step S12, the worker produces the first to sixth parts 21 to 26 at the production panel 100 according to the above layout by a general build-up process for a laminated printed circuit board. This step is executed together with, for example, the fabrication of the multi-piece board 50.

Then, in step S13, the worker performs an electrification test on the third part 23, the fourth part 24, the fifth part 25 and the sixth part 26. Any part which is determined as a defect in the electrification test is repaired or discarded. In later steps, only those parts which are determined as defect-free parts are used. The defective parts are replaced with defect-free parts from another production panel or the like, for example.

Figure 6:
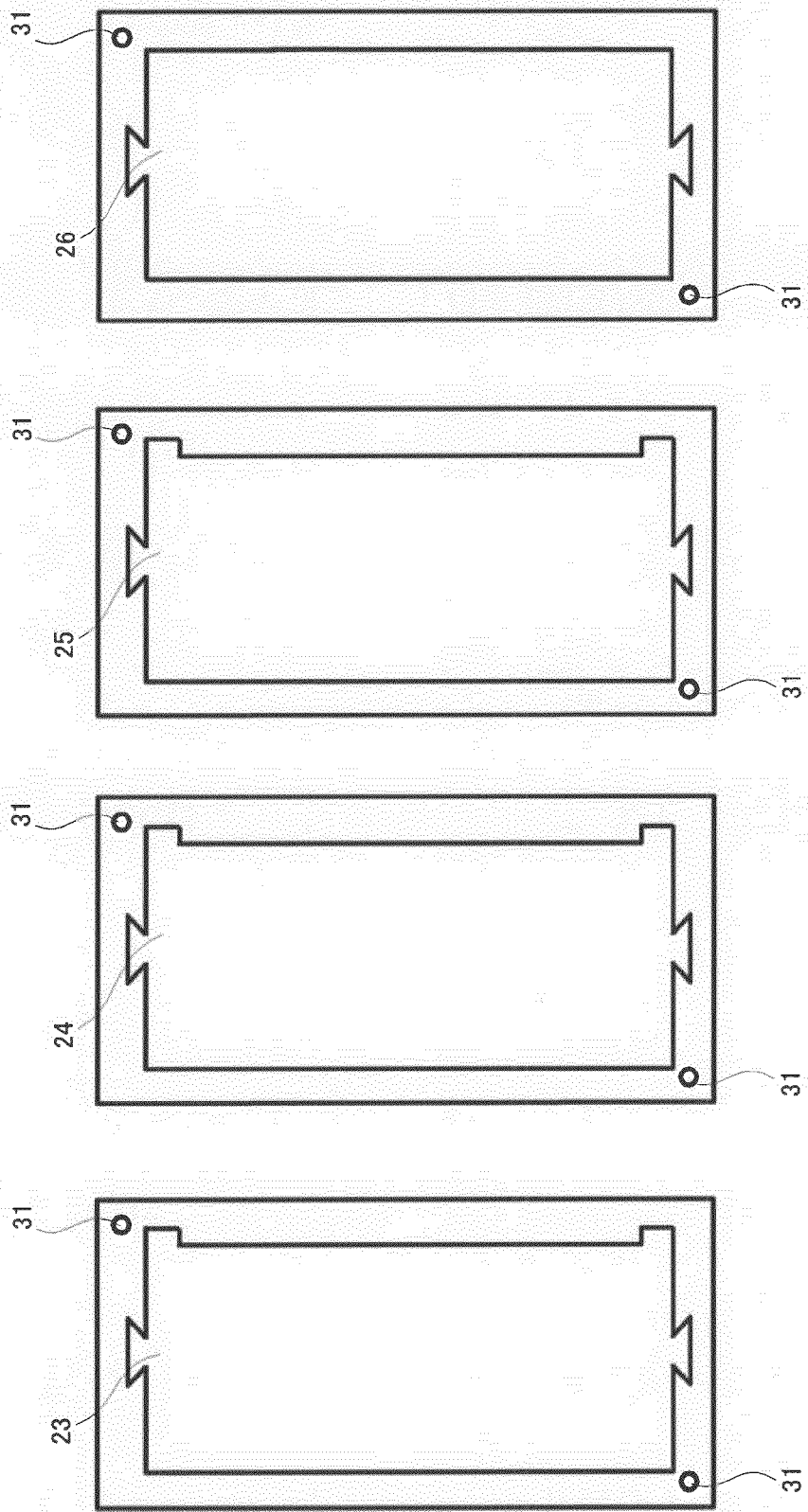
FIG. 6 is a diagram showing parts secured by pins.

Next, in step S14, the worker sets pins 31 on near the third part 23, the fourth part 24, the fifth part 25 and the sixth part 26 to secure the production panel 100 as shown in FIG. 6. Then, the worker cuts the third to sixth parts 23 to 26 in sizes larger than the outside dimensions (design sizes) by an ordinary router machine (router without the alignment capability). At this time, the cutaway lines are made in, for example, a rectangular shape. The rectangular sizes are set with some margins around the third to sixth parts 23 to 26 with respect to the outside dimensions (design sizes). This step is executed together with, for example, cutting of the multi-piece board 50. The shape of the cutaway lines may be other than the rectangular shape, e.g., a parallelogram, circular or elliptical shape.

Figure 7:
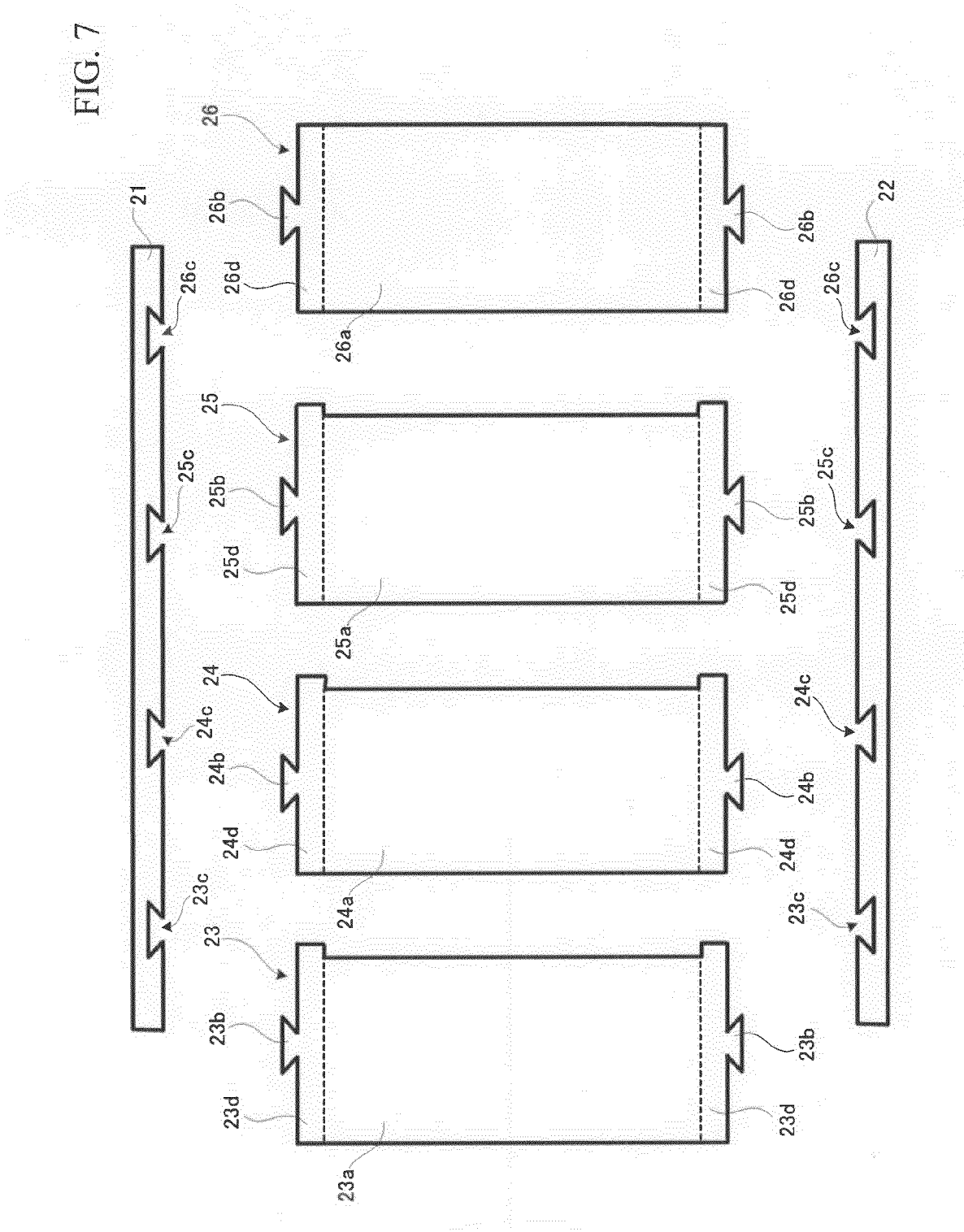
FIG. 7 is a diagram for explaining a step of separating parts from a production panel.

In next step S15, the worker finishes the third to sixth parts 23 to 26, together with the first and second parts 21 and 22, to predetermined outside dimensions (design sizes), as shown in FIG. 7 by an alignment router machine (router with the alignment capability). The alignment router is higher in accuracy but slower in processing than an ordinary router. The outside dimensions of the first and second parts 21 and 22 are set smaller than the outside dimensions of the frame parts 11a and 11b.

The first and second parts 21 and 22 each have claw receiving portions 23c to 26c at the lower end portions (the piece-side long sides to be connected to the bridges). The third to sixth parts 23 to 26 respectively are body parts 23a, 24a, 25a and 26a, claws 23b, 24b, 25b and 26b, and bridge portions 23d, 24d, 25d and 26d. The claws 23b to 26b are respectively fitted in the claw receiving portions 23c to 26c.

The body parts 23a to 26a correspond to the piece parts 12a to 12d.

The claws 23b to 26b are provided at end faces of the body parts 23a to 26a, specifically, at the short sides that face the frame part. The claws 23b to 26b are connected to the body parts 23a to 26a by the bridge portions 23d to 26d, respectively. The claws 23b to 26b are trapezoidal projections expanding toward the respective claw receiving portions 23c to 26c as the fitting mates. The claw receiving portions 23c to 26c have shapes (the trapezoidal shapes) in which the projections of the claws 23b to 26b are to be fitted. As those coupling portions, namely the claws 23b to 26b and the claw receiving portions 23c to 26c, are fitted together, the frame parts 11a and 11b and the piece parts 12a to 12d (FIG. 1) are connected together.

The bridge portions 23d to 26d include the bridges 121a to 121d, 122a to 122d shown in FIG. 1, and the lower end portions (piece-side long sides) of the frame parts 11a and 11b. Accordingly, the lengthwise sizes of the third to sixth parts 23 to 26 are set larger than the outside dimensions of the piece parts 12a to 12d. The bridge portions 23d to 26d extend to contact the adjoining piece parts in order to secure the areas where the bridges 121a to 121d, and 122a to 122d (FIG. 1) are formed.

Figure 8:
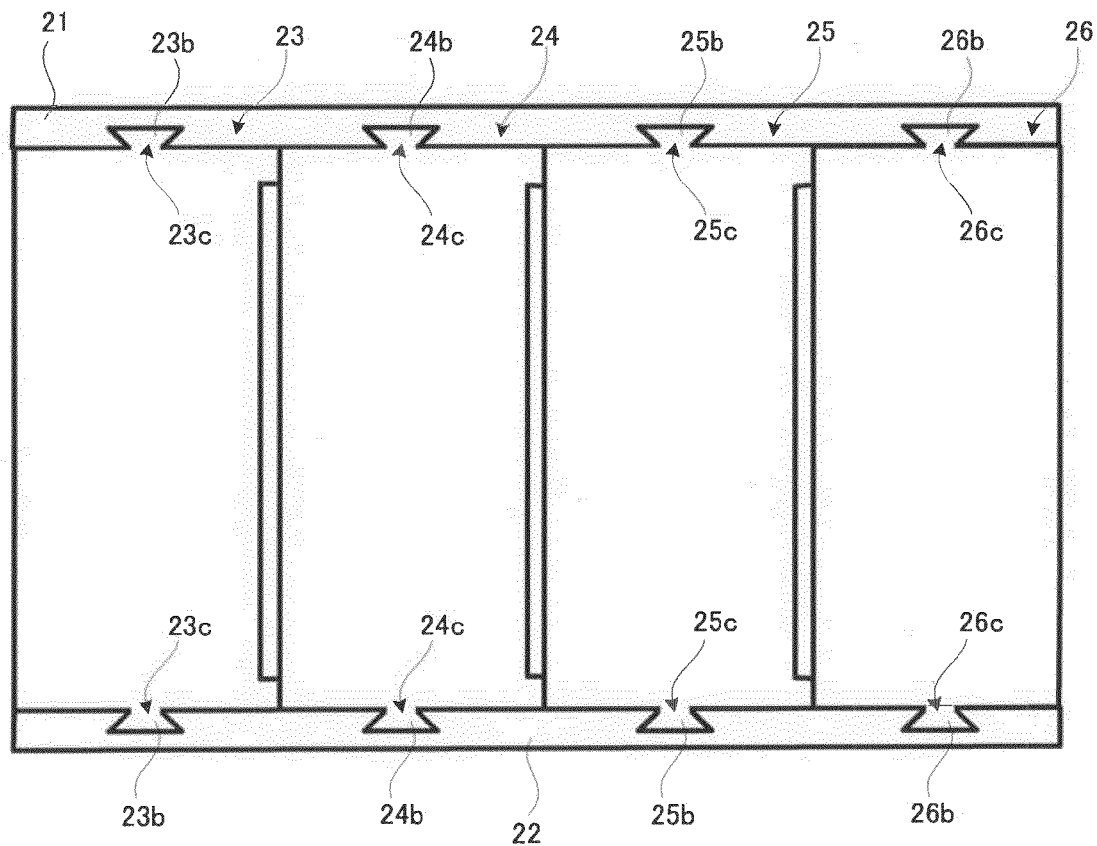
FIG. 8 is a diagram for explaining a step of fitting parts.

Next, in step S16 (FIG. 4), the worker combines the first and second parts 21 and 22 and the third to sixth parts 23 to 26. Specifically, as shown in FIG. 8, the worker manually fits the claws 23b to 26b into the claw receiving portions 23c to 26c, respectively. This connects the third to sixth parts 23 to 26 to the first and second parts 21 and 22. The first to sixth parts 21 to 26 are fixed (temporarily connected) by frictional force between the claw receiving portions 23c to 26c and the claws 23b to 26b.

Figure 9:
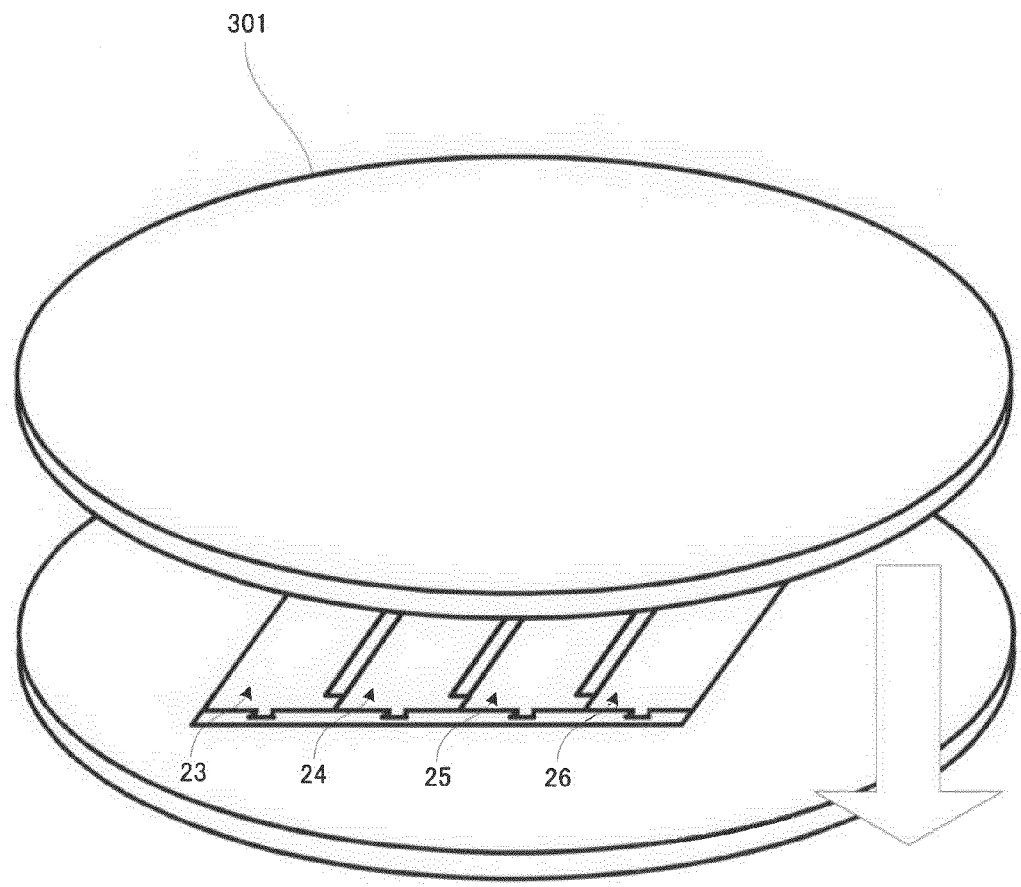
FIG. 9 is a diagram for explaining a step of flattening joint portions.

In next step S17, the worker presses and flattens the board with a manual pressing machine 301, as shown in FIG. 9. The joint portions between the first and second parts 21 and 22 and the third to sixth parts 23 to 26 are flattened. The flattening means is optional. For example, an automatic pressing machine, a roller pressing machine or the like may be used to achieve the flattening. The use of an automatic pressing machine or a roller pressing machine brings about an effect of improving the workability.

Figure 10:
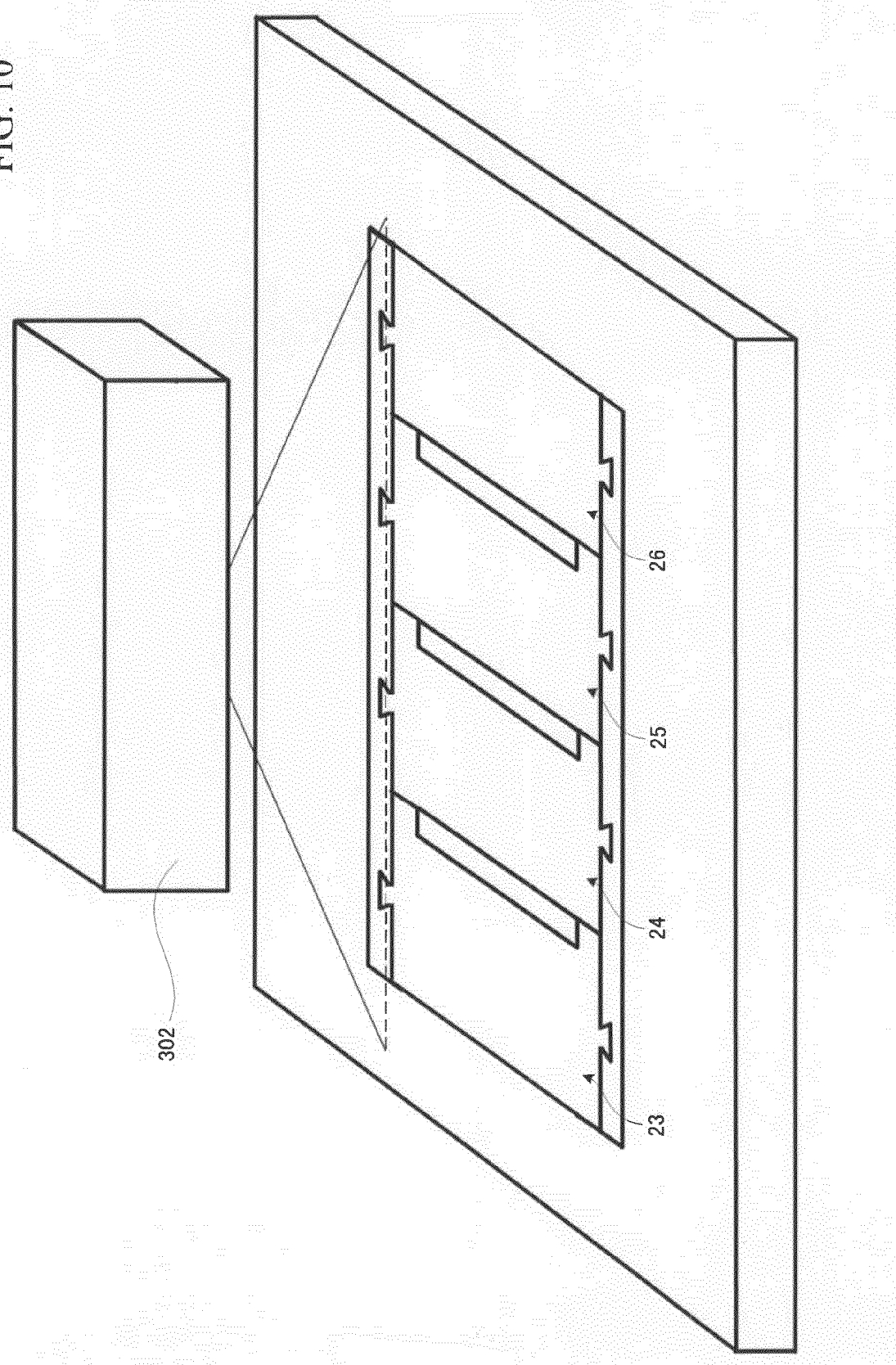
FIG. 10 is a diagram for explaining a step of checking the degree of flatness.

In next step S18, the worker examines the degree of flatness of the board with a laser displacement meter 302, as shown in FIG. 10. Subsequently, the worker determines whether the degree of flatness is proper in step S19. When it is determined in step S19 that the degree of flatness is not proper (step S19: NO), the worker returns to step S17 to carry out pressing again.

In next step S20, the worker adheres the joint portions using, for example, an adhesive. For example, after adhering the joint portions with a photo-curing acrylic adhesive (temporal attachment), the worker reinforces the temporarily-attached portions with, for example, a heat-hardening epoxy adhesive. The epoxy adhesive is hardened as it undergoes a heat treatment in an oven at 100° C. for 20 minutes, for example. It is to be noted that the first and second parts 21 and 22 (frame parts) and the third to sixth parts 23 to 26 are also connected together by the fitting-originated frictional force. If a sufficient connection strength is obtained, both parts may be adhered (reinforced) with a non-heat-hardening adhesive alone without using a heat-hardening adhesive. The avoidance of the use of a heat-hardening adhesive can suppress a change (cure shrinkage or the like) in the shape of the board originating from a temperature change.

Figure 11:
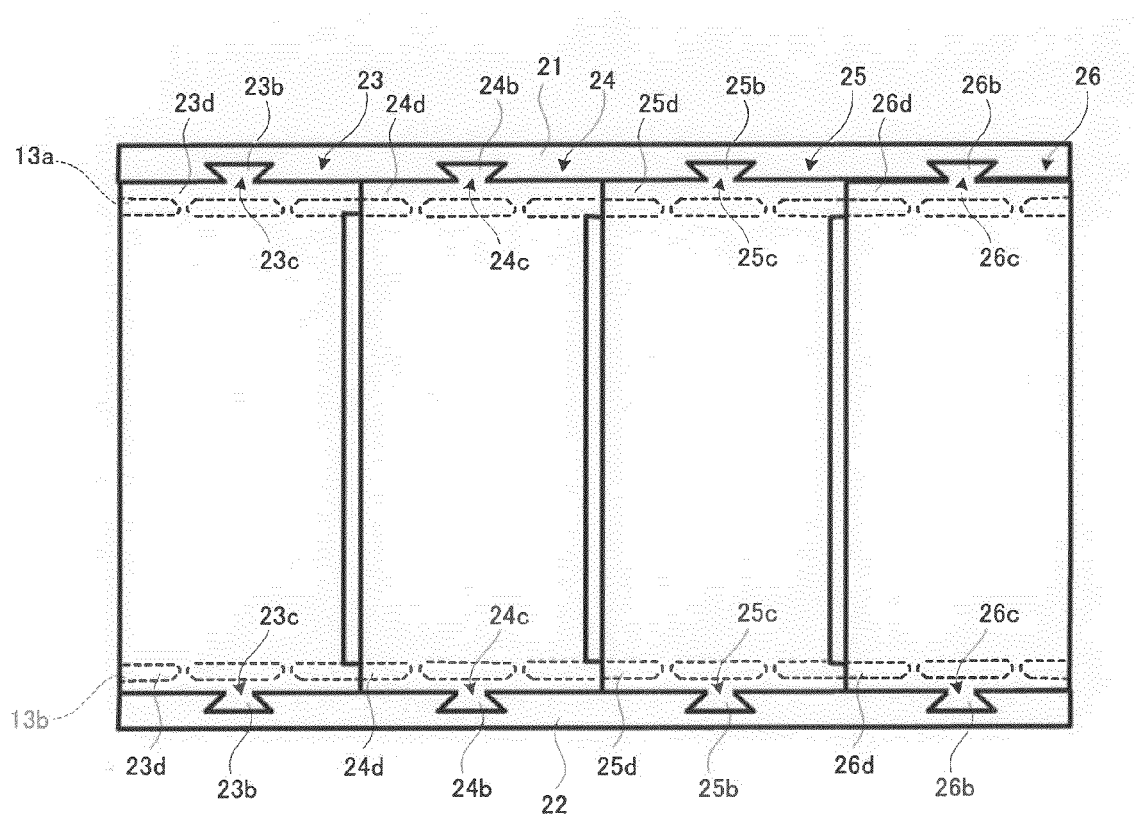
FIG. 11 is a plan view of a multi-piece board according to the first embodiment.

In next step S21, the worker forms slits between the bridge portions 23d to 26d and each piece part as indicated by broken lines in FIG. 11 using the ordinary router machine (router without the alignment capability). Accordingly, the piece parts 12a to 12d are separated, and the slits 13a and 13b and the bridges 121a to 121d, 122a to 122d are formed as shown in FIG. 1. As a result, the multi-piece board 10 is fabricated.

In next step S22, the worker corrects the warping of the board as needed.

In next step S23, the worker performs an electrification test on the piece parts 12a to 12d. If a defective piece is found in the electrification test, the worker performs a cut and patch repair to replace the defective piece with a defect-free one produced separately. The replacement of a defective piece with a defect-free piece can repair the multi-piece board. With such repair, discarding of the whole multi-piece board can be avoided when the multi-piece board becomes partly defective, so that other defect-free pieces will not be wasted. This can therefore improve the yield and the number of yielded products. As the electrification test has already been performed in step S13, the electrification test in step S23 may be omitted according to the purpose or the like.

Through the foregoing process, the multi-piece board with a collection of defect-free pieces only is formed.

According to the foregoing fabrication method, the frame parts 11a and 11b (first and second parts 21 and 22) are connected to a multi-piece parts 12a to 12d (third to sixth parts 23 to 26) by fitting the claws 23b to 26b (second coupling portions) into the respective claw receiving portions 23c to 26c (first coupling portions). This can allow the piece parts 12a to 12d to be disposed at accurate positions with respect to the frame parts 11a and 11b.

According to the fabrication method, the first to sixth parts 21 to 26 are laid out in the free space of the production panel 100 (one of production panels) for fabricating the another multi-piece board 50. Then, the first to sixth parts 21 to 26 are produced according to the layout. The effective use of the free space of the production panel can improve the yield and the number of yielded products.

According to the fabrication method, those pieces which are determined as defect-free pieces in the examination process in step S13 are combined. This can eliminate defective pieces beforehand.

According to the fabrication method, outline processing of the third to sixth parts 23 to 26 is carried out in multiple stages (two stages). That is, the third to sixth parts 23 to 26 are cut in sizes larger than the outside dimensions (design sizes) in step S14, and are then finished to the predetermined outside dimensions (design sizes) by an alignment router in step S15. This makes the dimensional accuracy of the third to sixth parts 23 to 26 high. In particularly, the use of the alignment router can achieve the outline processing at the error level of, for example, ±20 μm. The improvement on the dimensional accuracy of the joint portions improves the precision of the alignment of the frame parts 11a and 11b with the piece parts 12a to 12d after connection.

According to the fabrication method, temporal attachment is carried out by fitting the claw receiving portions 23c to 26c over the claws 23b to 26b, thus eliminating the need for a tape or the like for temporal attachment. Therefore, the fixation with a tape is unnecessary. This can reduce the fabrication cost.

According to the fabrication method, after the claw receiving portions 23c to 26c are fitted over the claws 23b to 26b, and before the first and second parts 21 and 22 are adhered by an adhesive, the joint portions are flattened. This eliminates steps at the top surfaces of the piece parts 12a to 12d fitted in the frame parts, thus improving the positional accuracy. At the time electronic parts are mounted on the piece parts 12a to 12d each having a printed wiring board, therefore, defect-free mounted boards can be fabricated with a high yield with fewer defective pieces.

According to the fabrication method, the first and second parts 21 and 22 (frame parts) are adhered to both ends of the third to sixth parts 23 to 26 (piece parts) by an adhesive. What is more, temporal attachment is made by a non-heat-hardening adhesive (e.g., acrylic adhesive), after which the temporarily-attached portions are reinforced by a heat-hardening adhesive (epoxy adhesive). The use of an adhesive can achieve easy and surer adhesion. In addition, the temporal attachment with a non-heat-hardening adhesive beforehand can suppress a change (cure shrinkage or the like) in the shape of the board originating from a temperature change at the time of performing a heat treatment to harden the heat-hardening adhesive. Further, the reinforcement with the heat-hardening adhesive having a high adhesion strength can ensure surer adhesion. A non-heat-hardening adhesive is, for example, a photo-curing adhesive or two-component type acrylic adhesive, whose hardening does not require a heat treatment. The photo-curing adhesive is an adhesive which is hardened by irradiation of electromagnetic waves, such as ultraviolet rays, visible rays or the like. Particularly, a UV curing adhesive or an acrylic adhesive or the like is effective.

According to the fabrication method, the first and second parts 21 and 22 (frame parts) and the third to sixth parts 23 to 26 (piece parts) are connected together by the adhesion power of the adhesive as well as the fitting-originated frictional force. If a sufficient connection strength is obtained, both parts may be adhered (reinforced) with a non-heat-hardening adhesive alone without using a heat-hardening adhesive. The elimination of a heat-hardening adhesive if possible can suppress a change (cure shrinkage or the like) in the shape of the board originating from a temperature change.

According to the fabrication method, outline processing of the bridges 121a to 121d, 122a to 122d is carried out after the first to sixth parts 21 to 26 of the multi-piece board 10 are combined. The execution of the outline processing after the combination can provide a higher dimensional accuracy and higher alignment accuracy than the execution of the outline processing before the combination.

(Second Embodiment)

A fabrication method according to the second embodiment, coupling portions to connect piece parts with one another are formed in addition to the coupling portions to connect the frame parts and piece parts.

Figure 12:
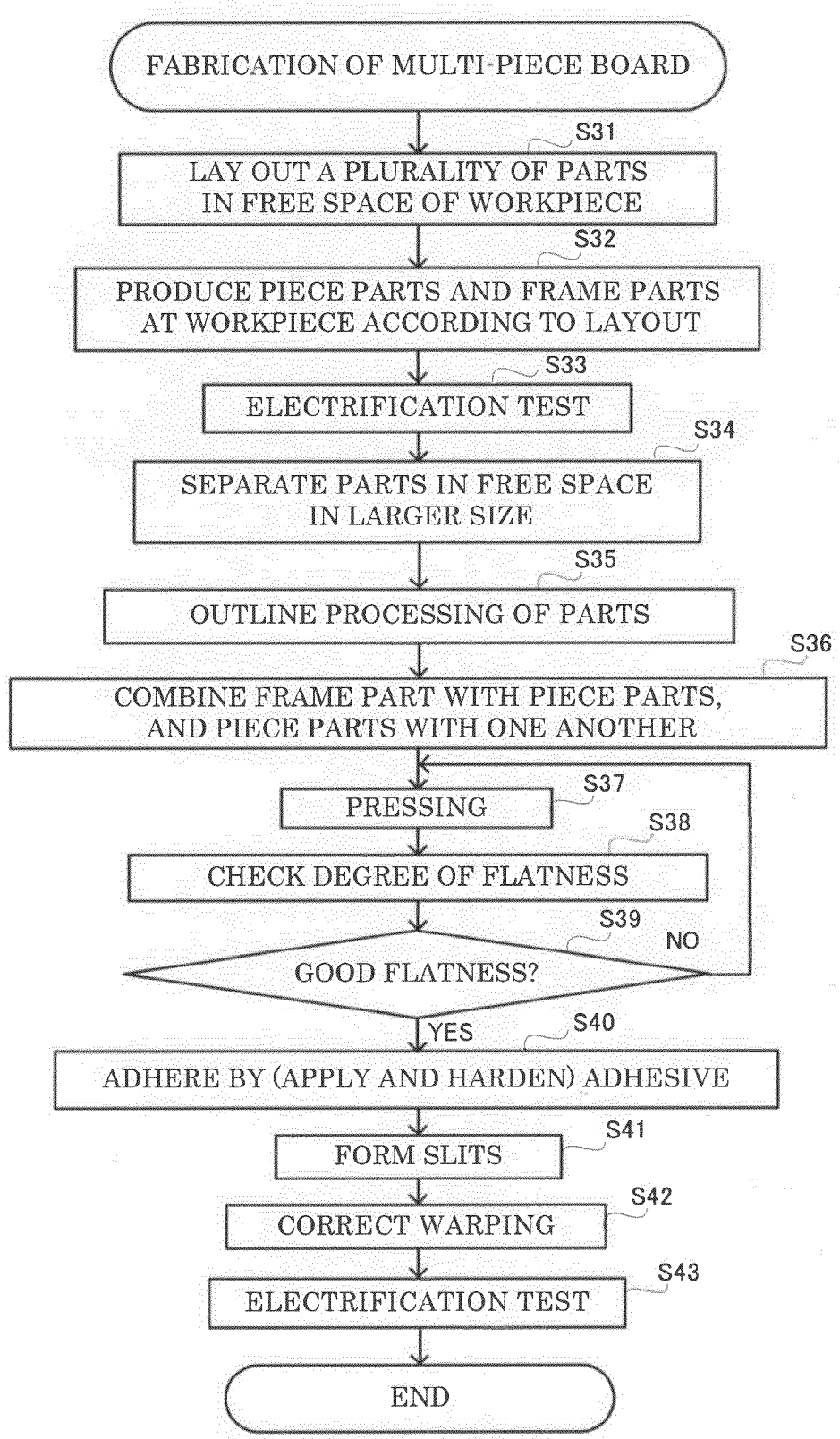
FIG. 12 is a flowchart illustrating procedures of the fabrication method for a multi-piece board according to a second embodiment of the invention.

In case of fabricating a multi-piece board 10 according to the fabrication method of the embodiment, for example, a worker executes a series of processes illustrated in FIG. 12.

Figure 13:
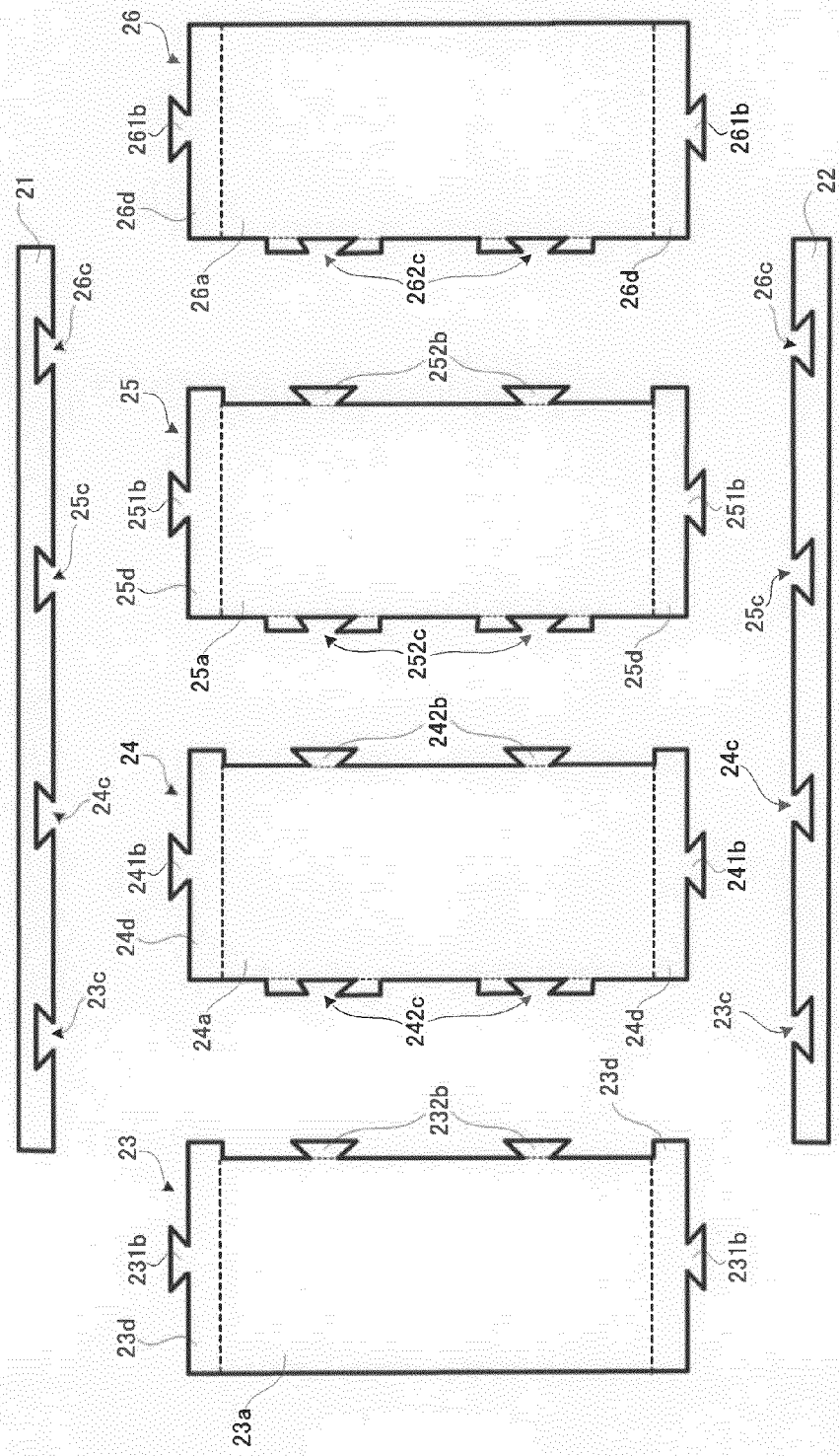
FIG. 13 is a diagram for explaining a step of separating parts from a production panel.

First, in steps S31 to S35, the worker finishes the third to sixth parts 23 to 26 along with the first and second parts 21 and 22 to predetermined outside dimensions (design sizes) as shown in FIG. 13 by carrying out processes similar to those of steps S11 to S15. The first and second parts 21 and 22 each have claw receiving portions 23c to 26c. The third to sixth parts 23 to 26 respectively have claws 231b to 261b which are to be fitted in claw receiving portions 23c to 26c. The fourth to sixth parts 24 to 26 further have claw receiving portions 242c to 262c, respectively. The third to fifth parts 23 to 25 further have claws 232b to 252b respectively. The claw receiving portions 242c to 262c and the claws 232b to 252b connect the adjoining piece parts.

The claw receiving portions 242c to 262c and the claws 232b to 252b both have projections. That is, the claws 232b to 252b have trapezoidal projections expanding toward the respective fitting mates (adjoining piece parts) or the claw receiving portions 242c to 262c. The claw receiving portions 242c to 262c are each formed as a recess between two projections provided at a predetermined interval therebetween. The recesses have shapes (the trapezoidal shapes) in which the projections of the claws 232b to 252b are to be fitted. As those coupling portions are fitted together, multiple adjoining piece parts are connected together. That is, the third part 23 has the claws 232b, the fourth part 24 arranged adjacent to the third part 23 has the claw receiving portions 242c to be fitted over the claws 232b, and the claws 242b, the fifth part 25 arranged adjacent to the fourth part 24 has the claw receiving portions 252c to be fitted over the claws 242b, and the claws 252b, and the sixth part 26 arranged adjacent to the fifth part 25 has the claw receiving portions 262c to be fitted over the claws 252b.

Figure 14:
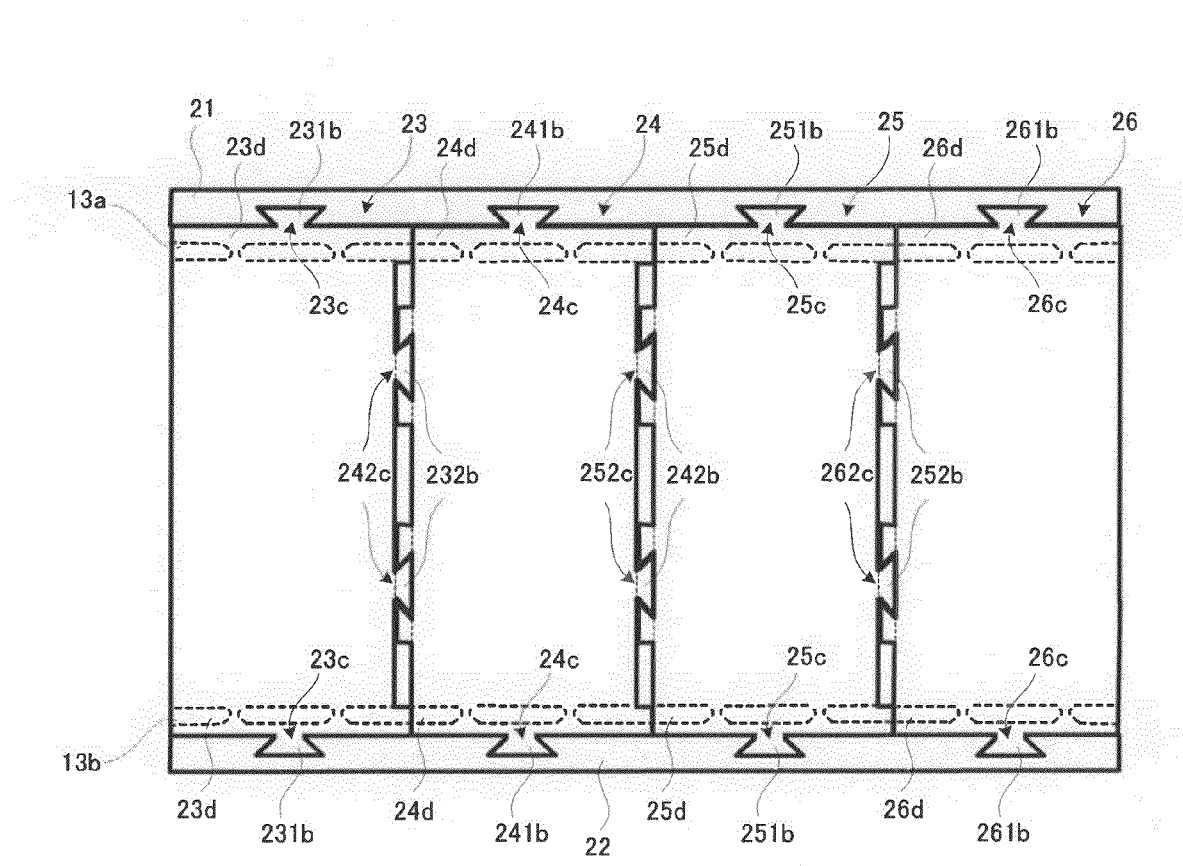
FIG. 14 is a plan view of a multi-piece board according to the second embodiment.

In next step S36 (FIG. 12), the worker connects the first and second parts 21 and 22 to the third to sixth parts 23 to 26, and connects the third to sixth parts 23 to 26 with one another, as shown in FIG. 14. Specifically, the worker manually fits the claws 23b to 26b into the claw receiving portions 23c to 26c, respectively, and fits the claws 232b to 252b into the claw receiving portions 242c to 262c, respectively. This connects the third to sixth parts 23 to 26 to the first and second parts 21 and 22, and connects the third to sixth parts 23 to 26 to one another. Those parts are fixed (temporarily connected) by frictional force between the claw receiving portions and the claws.

Subsequently, in steps S37 to S43 (FIG. 12) similar to steps S17 to S23, flattening and adhesion of the joint portions, formation of the slits and separation of the piece parts (broken lines in FIG. 14), correction of warping, the electrification test and so forth are carried out to complete the multi-piece board 10 (FIG. 1). In step S41, the slits 13a and 13b (FIG. 1) are formed and the coupling portions between the claw receiving portions 242c to 262c and the claws 232b to 252b are removed to thereby separate the piece parts 12a to 12d (FIG. 1) from one another.

According to the foregoing fabrication method, the frame parts 11a and 11b (first and second parts 21 and 22) are connected to a multi-piece parts 12a to 12d (third to sixth parts 23 to 26) by fitting the claws 231b to 261b (second coupling portions) into the respective claw receiving portions 23c to 26c (first coupling portions). Further, the multi-piece parts 12a to 12d (third to sixth parts 23 to 26) are connected together by fitting the claws 232b to 252b (fourth coupling portions) into the respective claw receiving portions 242c to 262c (third coupling portions). This can ensure accurate arrangement of the frame parts 11a and 11b with the piece parts 12a to 12d as well as accurate arrangement of the piece parts 12a to 12d with one another. Further, the coupling portions are provided not only at the frame parts but also at mating portions of the adjoining pieces, thus bringing about an effect of improving the adhesion strength of the pieces connected to the frame.

The other processes similar to corresponding processes of the first embodiment of the invention provide effects matching those of the first embodiment.

(Third Embodiment)

According to a fabrication method of the embodiment, frame parts 11a and 11b are connected to piece parts 12a to 12d (FIG. 1) by filling an adhesive in clearances (gaps)

between coupling portions (claws and claw receiving portions). Positioning holes are formed in both the frame parts 11*a* and 11*b* and piece parts 12*a* to 12*d* before connection thereof.

Figure 15:
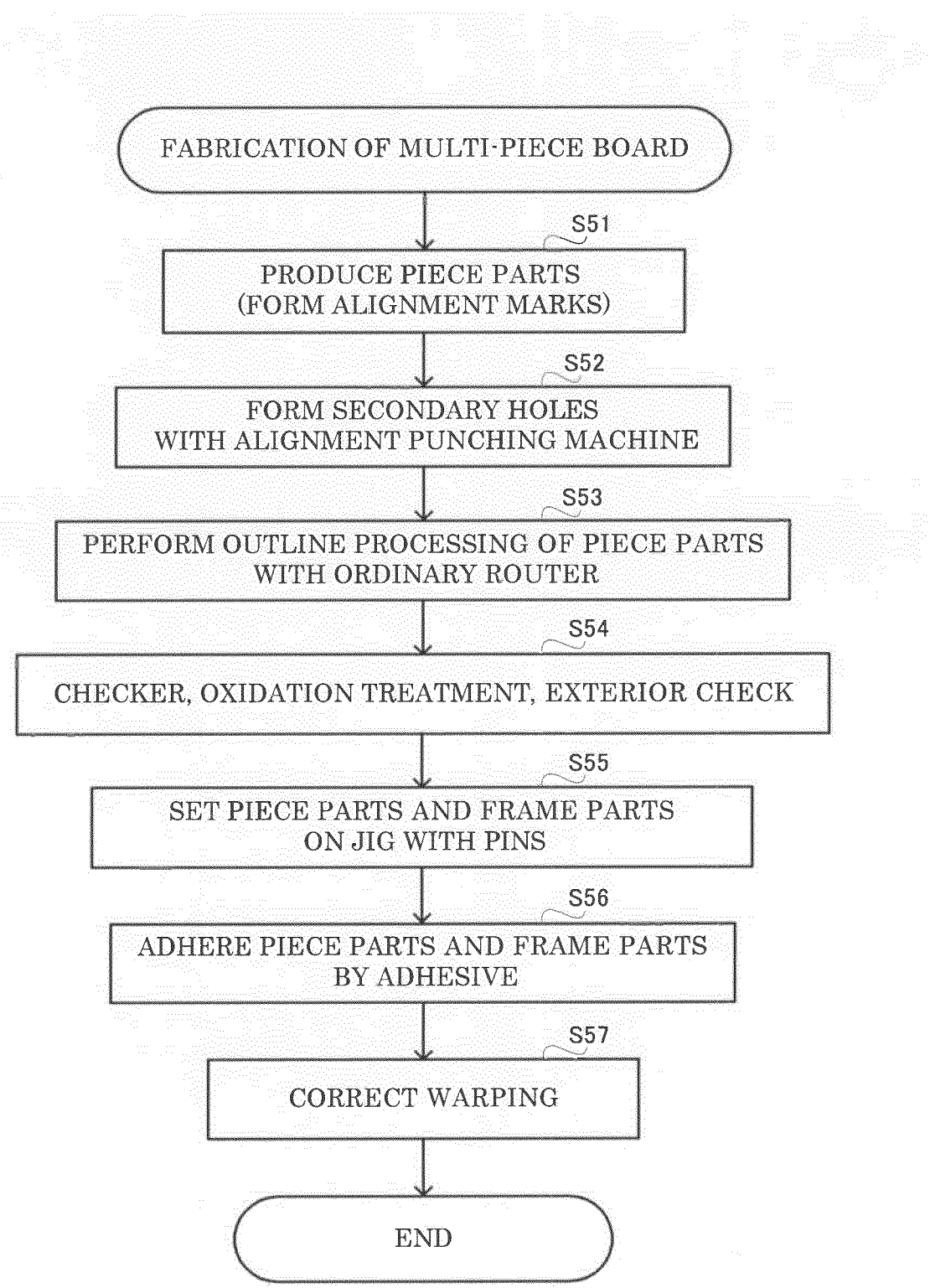
FIG. 15 is a flowchart illustrating procedures of the fabrication method for a multi-piece board according to a third embodiment of the invention.

In case of fabricating a multi-piece board 10 (FIG. 1) according to the fabrication method of the embodiment, for example, a worker executes a series of processes illustrated in FIG. 15.

Figure 16:
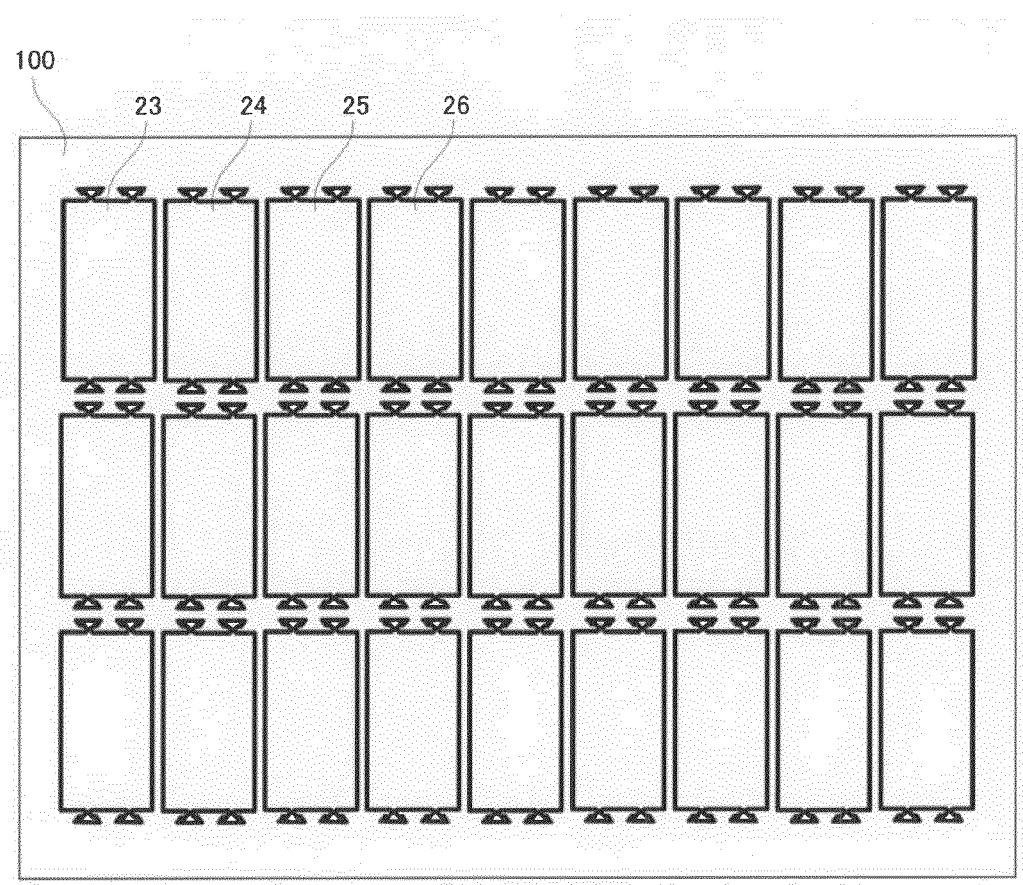
FIG. 16 is a diagram for explaining a step of producing piece parts at a production panel.

First, in step S51, the worker produces third to sixth parts 23 to 26 at a production panel 100 as shown in FIG. 16 by a general build-up process for a laminated printed circuit board, for example. The third part 23, the fourth part 24, the fifth part 25 and the sixth part 26 approximately correspond to the piece parts 12*a*, 12*b*, 12*c* and 12*d* (FIG. 1), respectively. In addition, the third to sixth parts 23 to 26 have the same forms in the embodiment.

Figure 17:
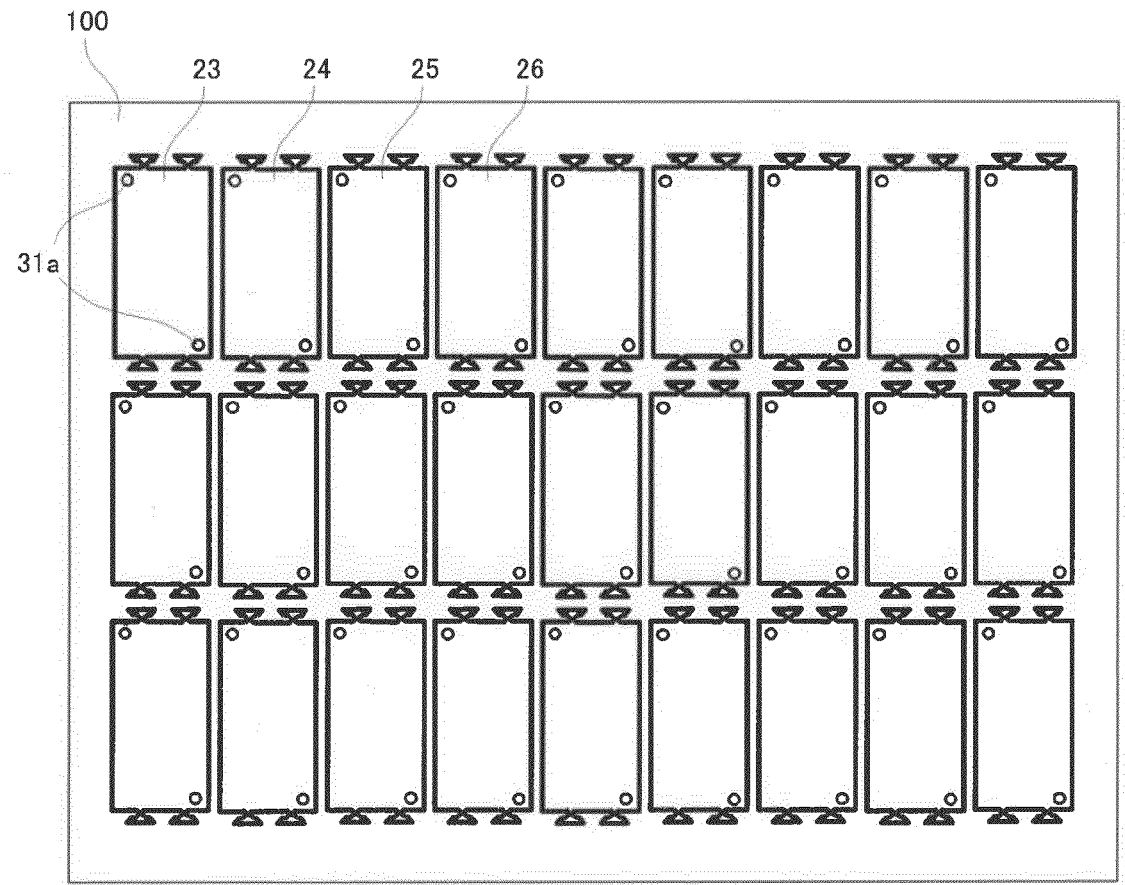
FIG. 17 is a diagram for explaining a step of forming positioning holes in the piece parts.

Next, in step S52, the worker forms positioning holes (secondary holes 31 a) as through holes as shown in FIG. 17 by, for example, an alignment punching machine.

High positional accuracy of the secondary holes 31*a* can be kept by forming alignment marks on, for example, the outermost wiring layer (e.g., conductive pattern made of copper) or the like in step S51, for example. When a protection film or the like is formed on the outermost wiring layer, the protection film or the like may be partly removed to expose the alignment marks at the time of positioning. It is to be noted that alignment marks, if optically identified even through the protection film or the like, need not be exposed.

In next step S53, the worker performs outline processing of the third to sixth parts 23 to 26 by an ordinary router machine (router without the alignment capability). Accordingly, the third to sixth parts 23 to 26 are separated from the production panel 100 as shown in FIG. 18.

Figure 18:
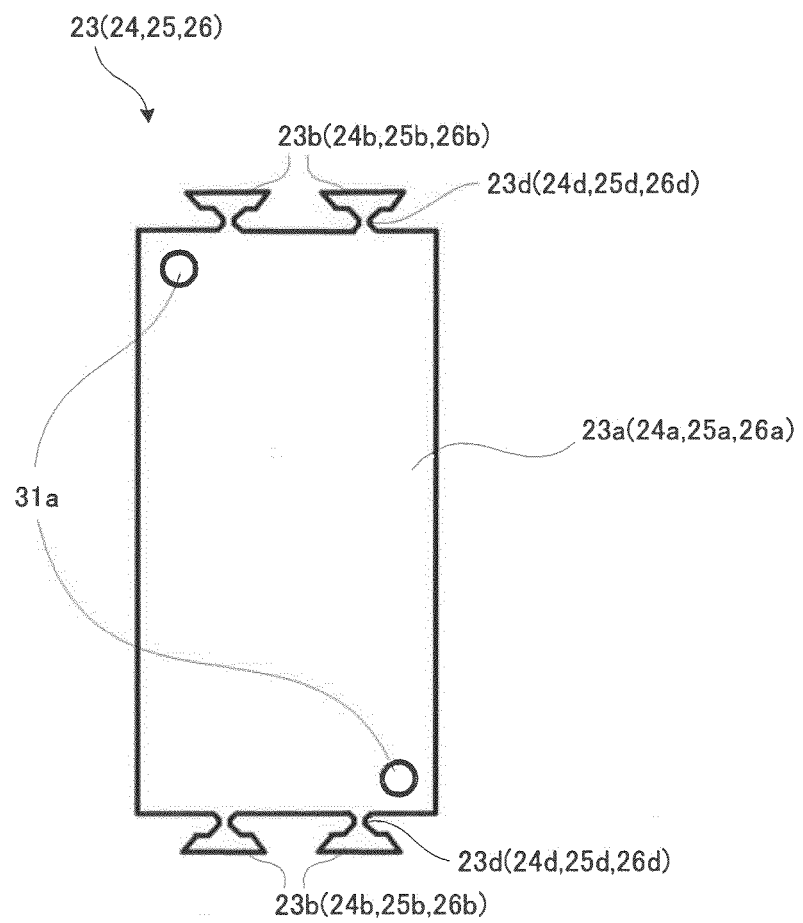
FIG. 18 is a diagram for explaining a step of separating the piece parts from the production panel.

As shown in FIG. 18, the third part 23 (or fourth part 24, fifth part 25 or sixth part 26) has a body part 23*a* (or body part 24*a*, 25*a*, 26*a*), claws 23*b* (or claws 24*b*, 25*b*, 26*b*), and bridge portions 23*d* (or bridge portions 24*d*, 25*d*, 26*d*). Because the third to sixth parts 23 to 26 have the same forms as mentioned above, only the form of the third part 23 will be elaborated as a representative form.

The body part 23*a* corresponds to the piece part 12*a* (FIG. 1), and the bridge portion 23*d* corresponds to the bridges 121*a*, 122*a* (FIG. 1).

The claws 23*b* are provided at end faces of the body part 23*a*, specifically, at the short sides that face the frame parts. The claw 23*b* is connected to the body part 23*a* by the bridge portion 23*d*. The claw 23*b* has a trapezoidal projection expanding toward the tip. The claws 23*b* are formed at, for example, four symmetrical locations (e.g., four corners) of the body part 23*a*. The third part 23 has a point-symmetrical form.

In next step S54, the worker uses a checker (electrification test device) on the third to sixth parts 23 to 26 as the individual parts to select only defect-free pieces, performs an oxidation treatment thereon, and checks the exteriors thereof.

Subsequently, in steps S55 and S56, the worker connects the third to sixth parts 23 to 26 to the first and second parts 21 and 22. The first and second parts 21 and 22 are produced separately from the third to sixth parts 23 to 26 as the worker, for example, executes a series of processes illustrated in FIG. 19. However, the production of the first and second parts 21 and 22 is not limited to such a manner; for example, the first and second parts 21 and 22 may be produced at a production panel common to the third to sixth parts 23 to 26, together with the third to sixth parts 23 to 26.

Figure 19:
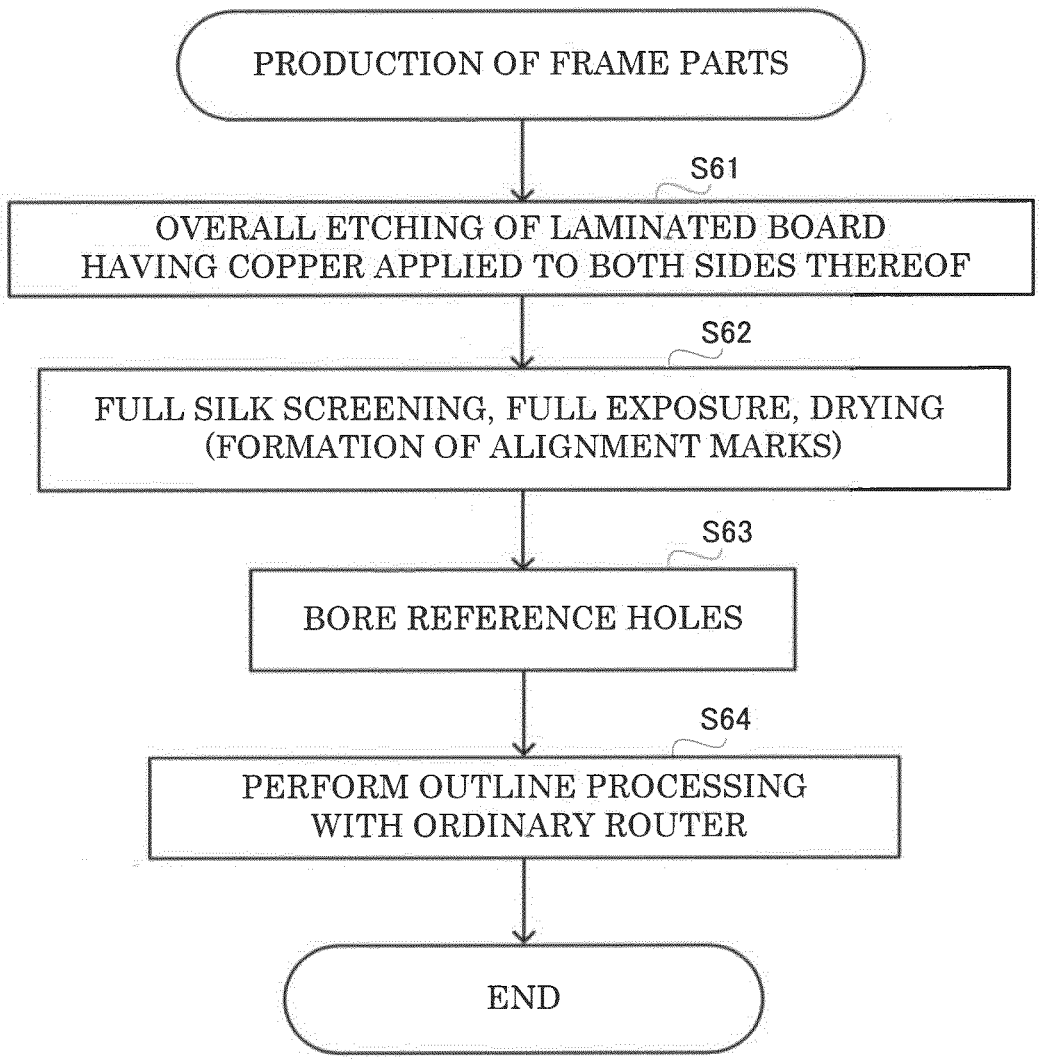
FIG. 19 is a flowchart illustrating procedures of producing frame parts.
Figure 20:
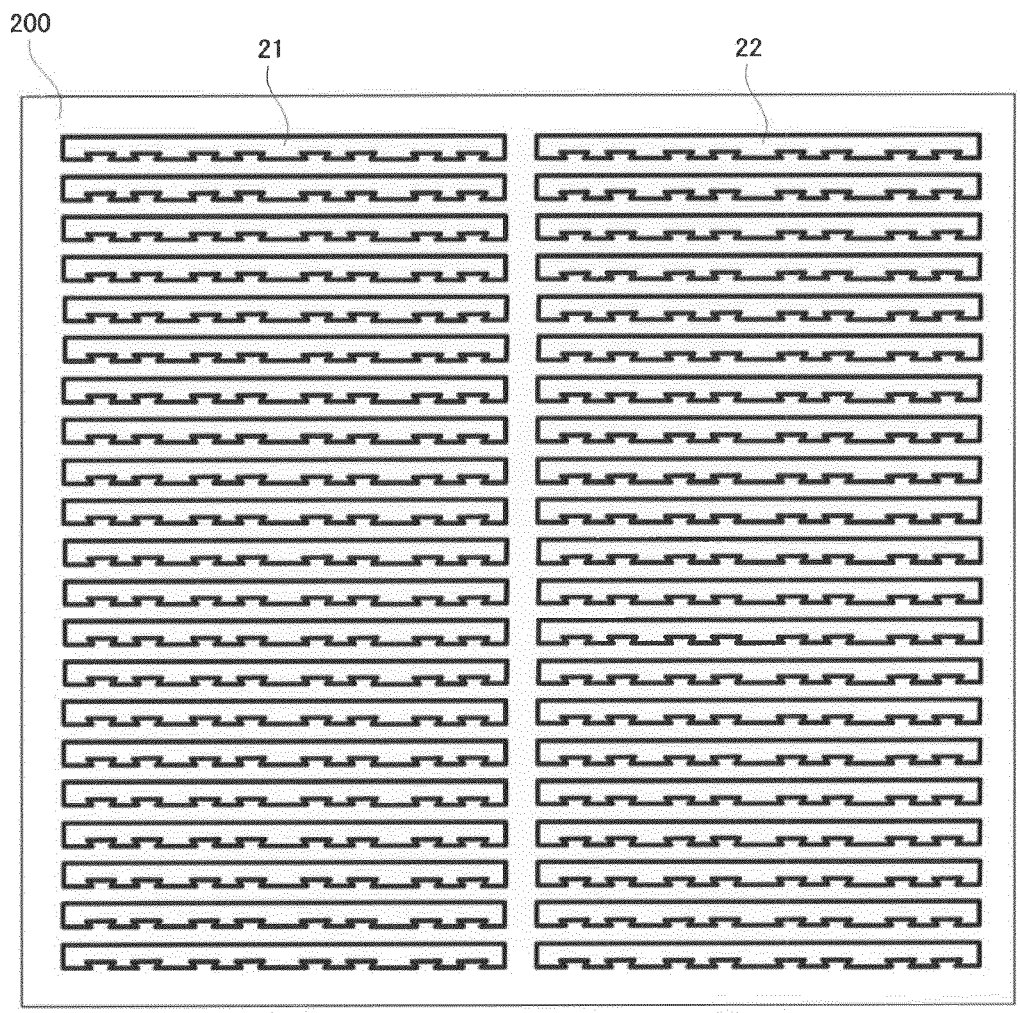
FIG. 20 is a diagram for explaining a step of producing the frame parts at the production panel.

In the embodiment, the worker produces the first and second parts 21 and 22 at another production panel 200 separate from the production panel 100 (FIG. 16), as shown in, for example, FIG. 20. Specifically, in step S61 in FIG. 19, the worker performs overall etching on the production panel 200 having a laminated board having copper applied to both sides thereof. In next step S62, the worker the worker silk-screens an insulating material, such as epoxy resin, on the entire surface of the production panel 200, and dries the production panel 200 after full exposure.

Figure 21:
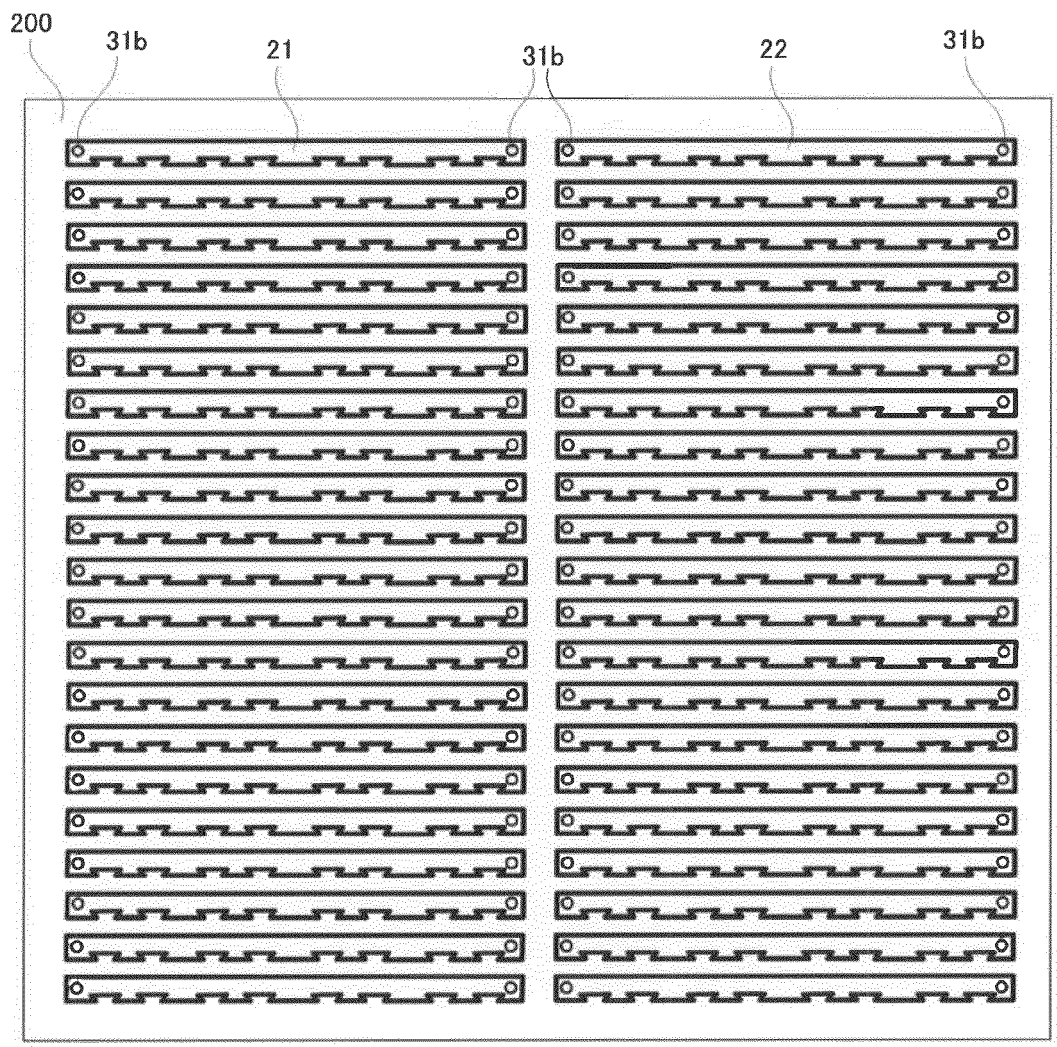
FIG. 21 is a diagram for explaining a step of forming positioning holes in the frame parts.

In next step S63, the worker makes reference holes 31*b* as shown in FIG. 21. High positional accuracy of the reference holes 31*b* can be kept by forming alignment marks by, for example, patterning, printing or the like of a copper film, in step S62 (or step S61), for example.

Figure 22:
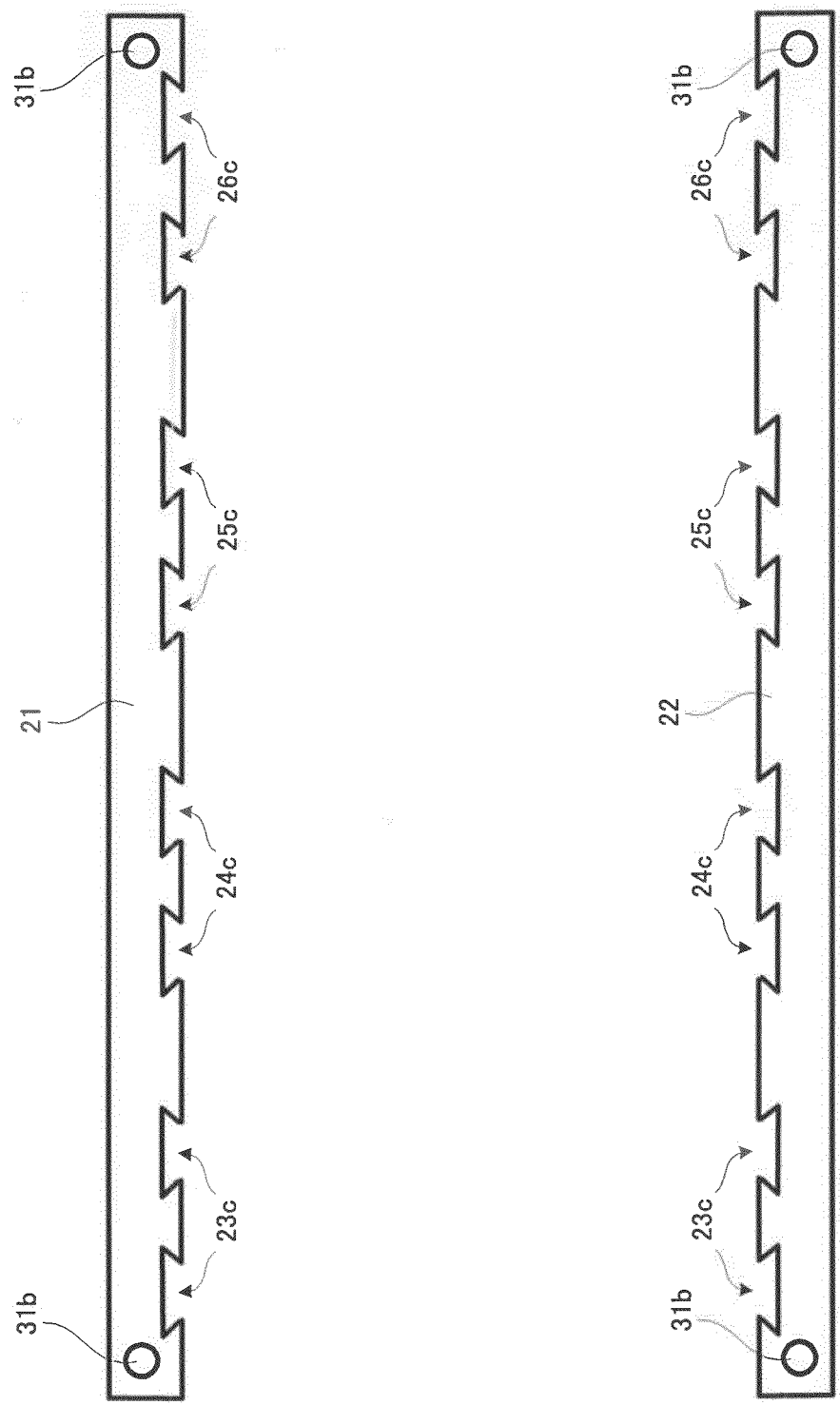
FIG. 22 is a diagram for explaining a step of separating the frame parts from the production panel.

In next step S64, the worker performs outline processing of the first and second parts 21 and 22 by an ordinary router machine as shown in FIG. 22, for example. Accordingly, the first and second parts 21 and 22 are separated in predetermined outside dimensions (design sizes).

The first part 21 and the second part 22 approximately correspond to the frame parts 11*a* and 11*b* (FIG. 1), respectively. Specifically, each of the first and second parts 21 and 22 has claw receiving portions 23*c* to 26*c* at the lower end portion (piece-side long side to be connected to the bridge), as shown in FIG. 22. The claw receiving portions 23*c* to 26*c* have shapes (aforementioned trapezoidal shapes) corresponding to the projections of the claws 23*b* to 26*b*. It is to be noted that predetermined clearances (gaps) between the claws 23*b* to 26*b* and the claw receiving portions 23*c* to 26*c*.

Figure 23:
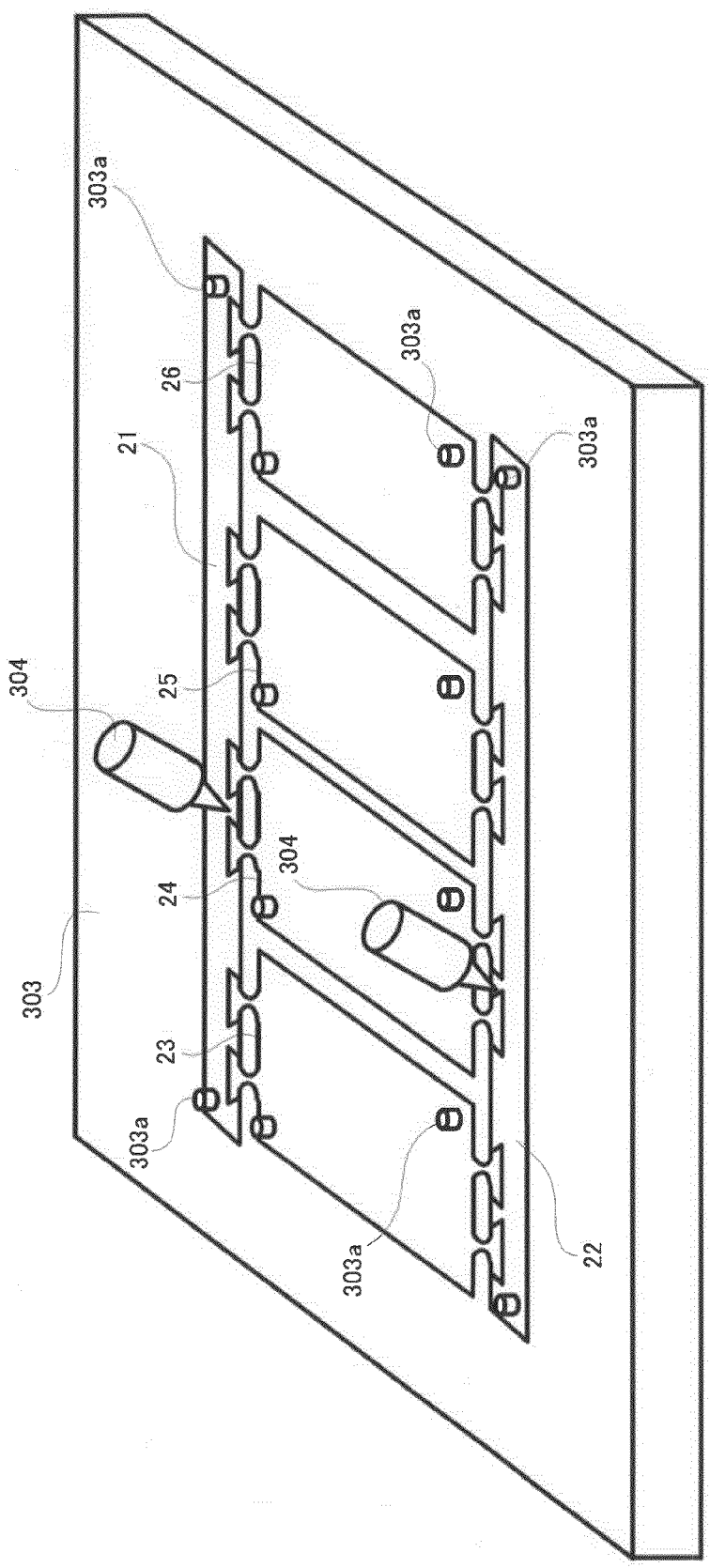
FIG. 23 is a diagram for explaining a step of setting frame parts and piece parts on a jig with pins.

In step S55 in FIG. 15, the worker sets the third to sixth parts 23 to 26 together with those first and second parts 21 and 22 on a jig 303 with pins 303*a* as shown in FIG. 23, for example. At this time, the worker inserts the pins 303*a* in the respective secondary holes 31*a* (FIG. 18) and reference holes 31*b* (FIG. 22) for positioning. This positioning allows the claws 23*b* to 26*b* (FIG. 18) to be inserted into the respective claw receiving portions 23*c* to 26*c* (FIG. 22). With the clearances provided between the claws 23*b* to 26*b* and the claw receiving portions 23*c* to 26*c*, the positional accuracy can be kept by the pins 303*a*.

Figure 24:
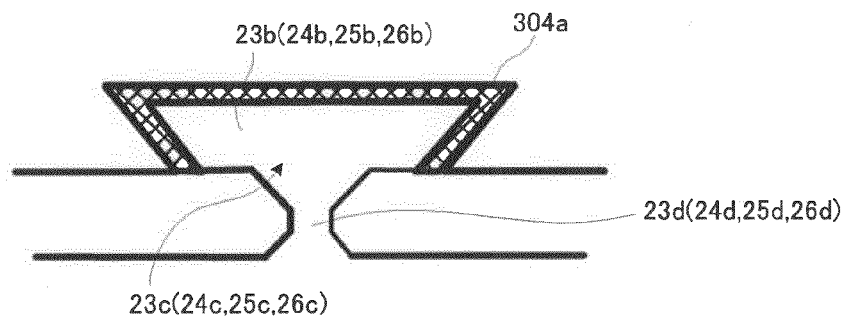
FIG. 24 is a partly enlarged view of FIG. 23.
Figure 25:
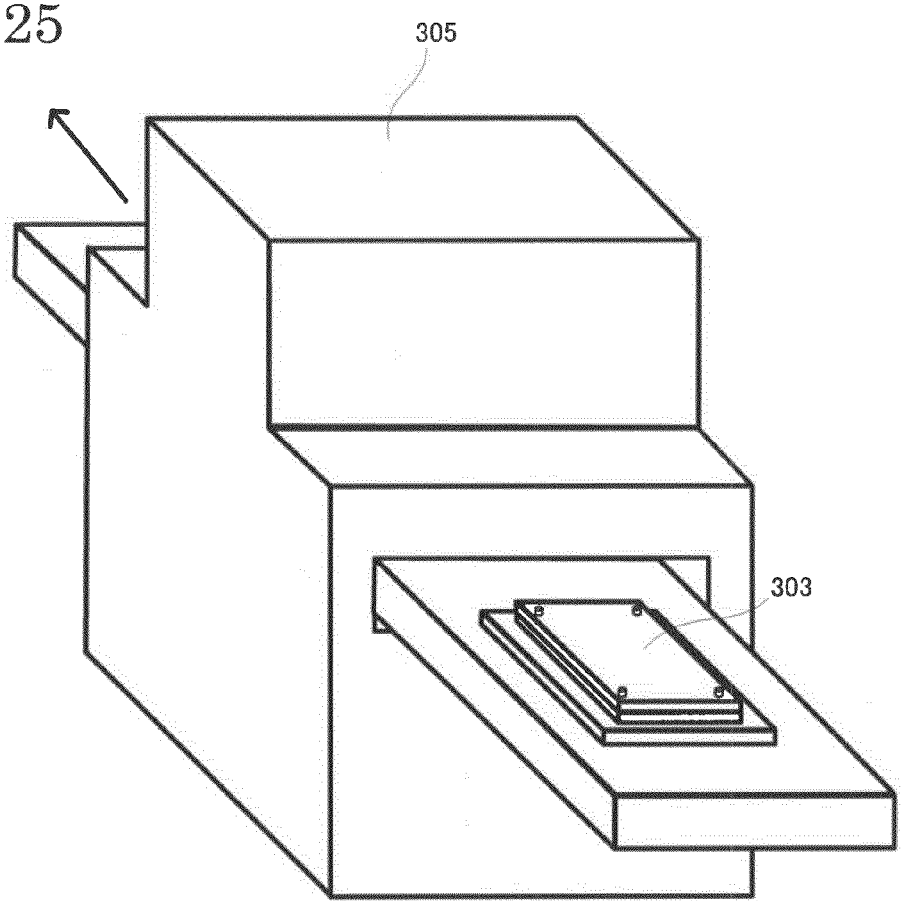
FIG. 25 is a diagram for explaining a step of irradiating UV (ultraviolet rays) onto an adhesive.

Next, with the first to sixth parts 21 to 26 fixed by the pins 303*a*, the worker applies, for example, a UV (UltraViolet rays) curing adhesive 304 to joint portions between the first and second parts 21 and 22 and the third to sixth parts 23 to 26 in step S56. Accordingly, an adhesive paste 304*a* is filled in the joint portions as shown in FIG. 24 (partly enlarged view of FIG. 23), for example. Then, as shown in FIG. 25, for example, the worker lets the first to sixth parts 21 to 26 set on the jig 303 flow to a conveyor type UV irradiation unit 305 to irradiate UV to the adhesive paste 304*a*. As a result, the first and second parts 21 and 22 are connected (adhered) to the third to sixth parts 23 to 26. It is preferable that to prevent UV from hitting on the portion where the UV should not be irradiated, a cover or so should be placed on the portion other than where the UV is to be irradiated at the time of irradiating the UV.

In next step S57, the worker corrects the warping of the board. This completes the multi-piece board 10 as shown in FIG. 1.

According to the fabrication method of the embodiment, the frame parts 11*a* and 11*b* are connected to the piece parts 12*a* to 12*d* by filling the adhesive paste 304*a* in the clearances (gaps) between the claws 23*b* to 26*b* and the claw receiving portions 23*c* to 26*c*. This can allow the claws 23*b* to 26*b* and the claw receiving portions 23*c* to 26*c* to be formed quickly by simple cutting means, e.g., the ordinary router or the like, without using an alignment router or the like which takes time in processing. Further, the positioning holes (secondary holes 31a) are formed before connection of both the frame parts 11a and 11b and piece parts 12a to 12d. This makes it possible to position both the frame parts 11a and 11b and piece parts 12a to 12d at a high accuracy. As a result, the prompt outline processing can improve the number of yielded products per unit time.

The other processes similar to corresponding processes of the first embodiment of the invention provide effects matching those of the first embodiment.

(Fourth Embodiment)

According to a fabrication method of the embodiment, frame piece parts 12a to 12d are produced connected to one another.

Figure 26:
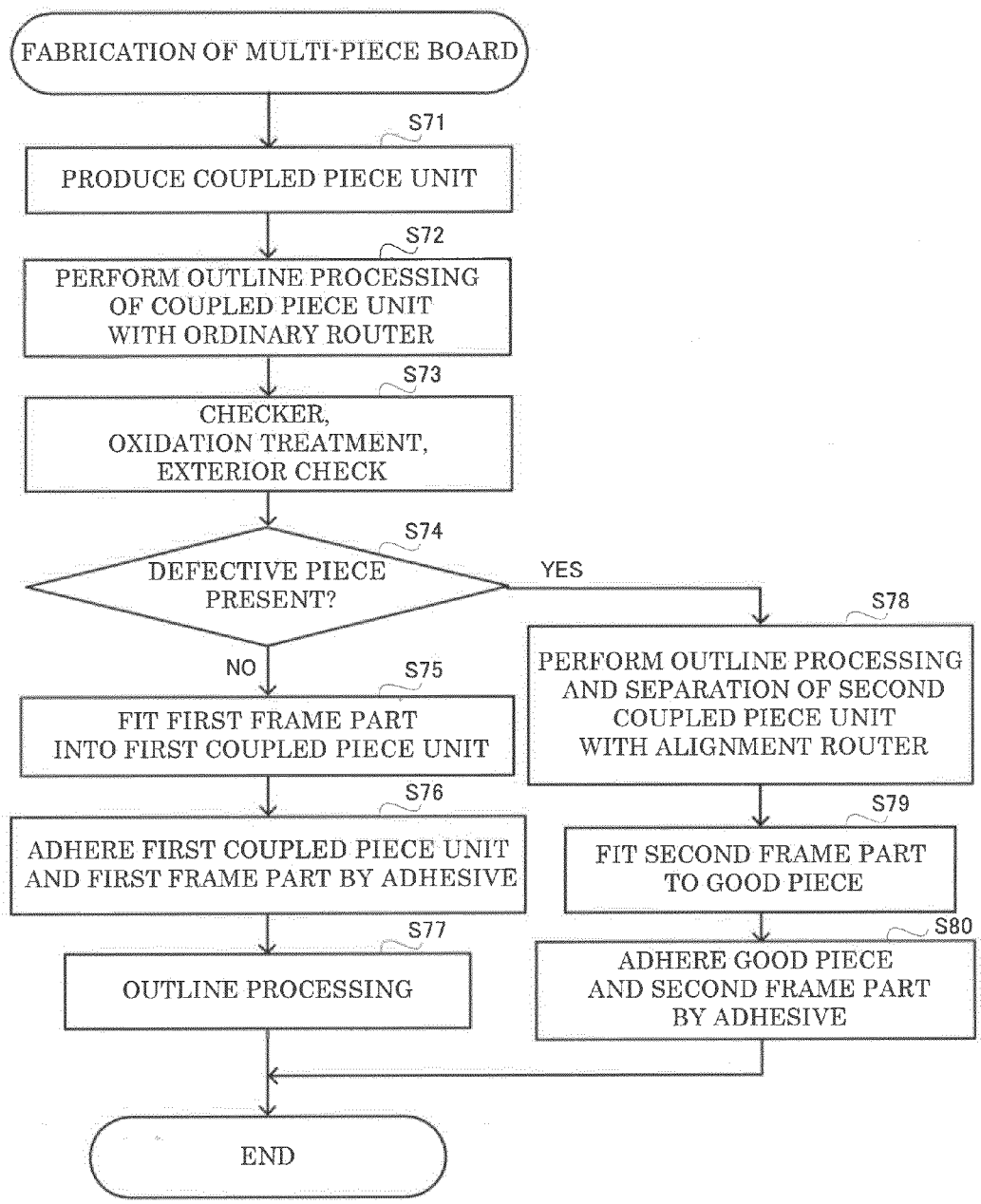
FIG. 26 is a flowchart illustrating procedures of the fabrication method for a multi-piece board according to a fourth embodiment of the invention.

In case of fabricating a multi-piece board 10 (FIG. 1) according to the fabrication method of the embodiment, for example, a worker executes a series of processes illustrated in FIG. 26.

Figure 27:
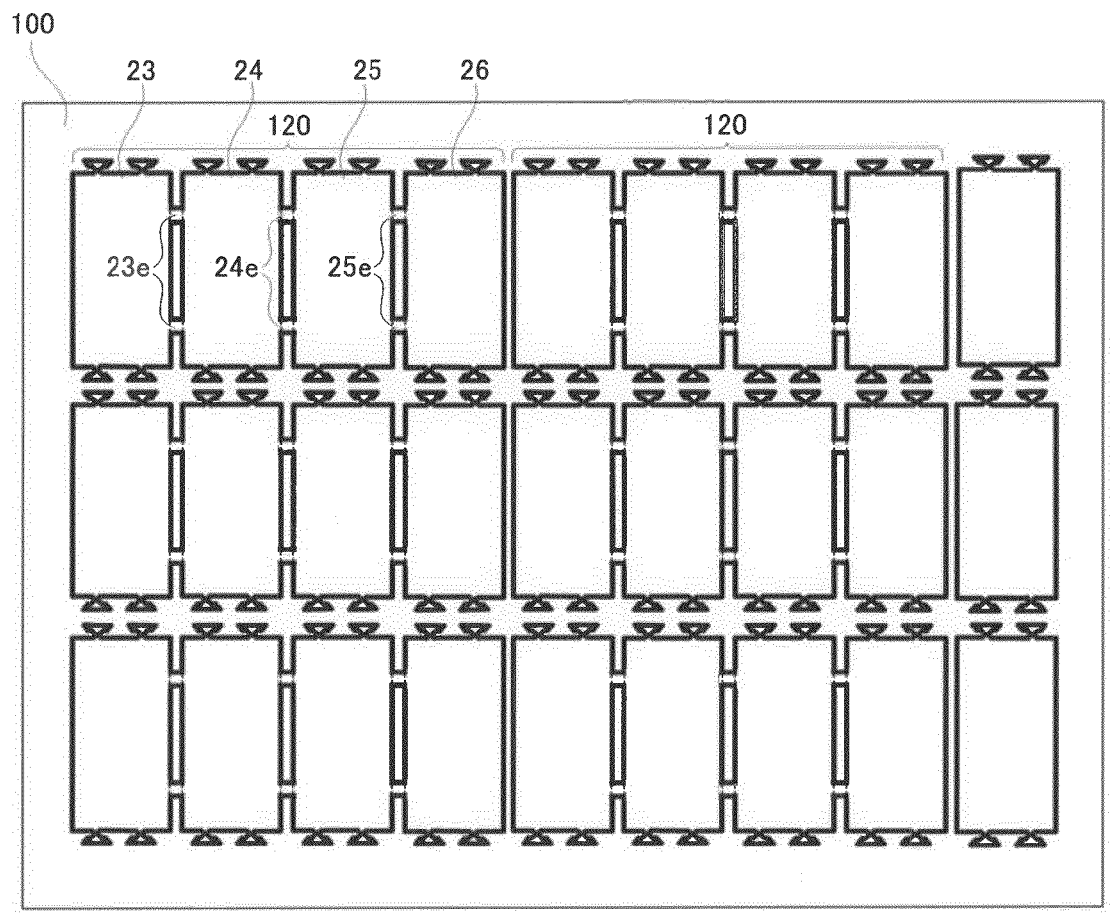
FIG. 27 is a diagram for explaining a step of producing a coupled piece unit at a production panel.

First, in step S71, the worker produces third to sixth parts 23 to 26, connected to one another, at a production panel 100 as shown in FIG. 27 by a general build-up process for a laminated printed circuit board, for example. The third part 23, the fourth part 24, the fifth part 25 and the sixth part 26 approximately correspond to the piece parts 12a, 12b, 12c and 12d (FIG. 1), respectively. In addition, the third to sixth parts 23 to 26 have the same forms. Further, according to the embodiment, the third to sixth parts 23 to 26 are coupled to one another by lateral coupling portions 23e to 25e in the delivery unit of products (=piece parts 12a to 12d), for example, thus constituting a coupled piece unit 120.

Figure 28:
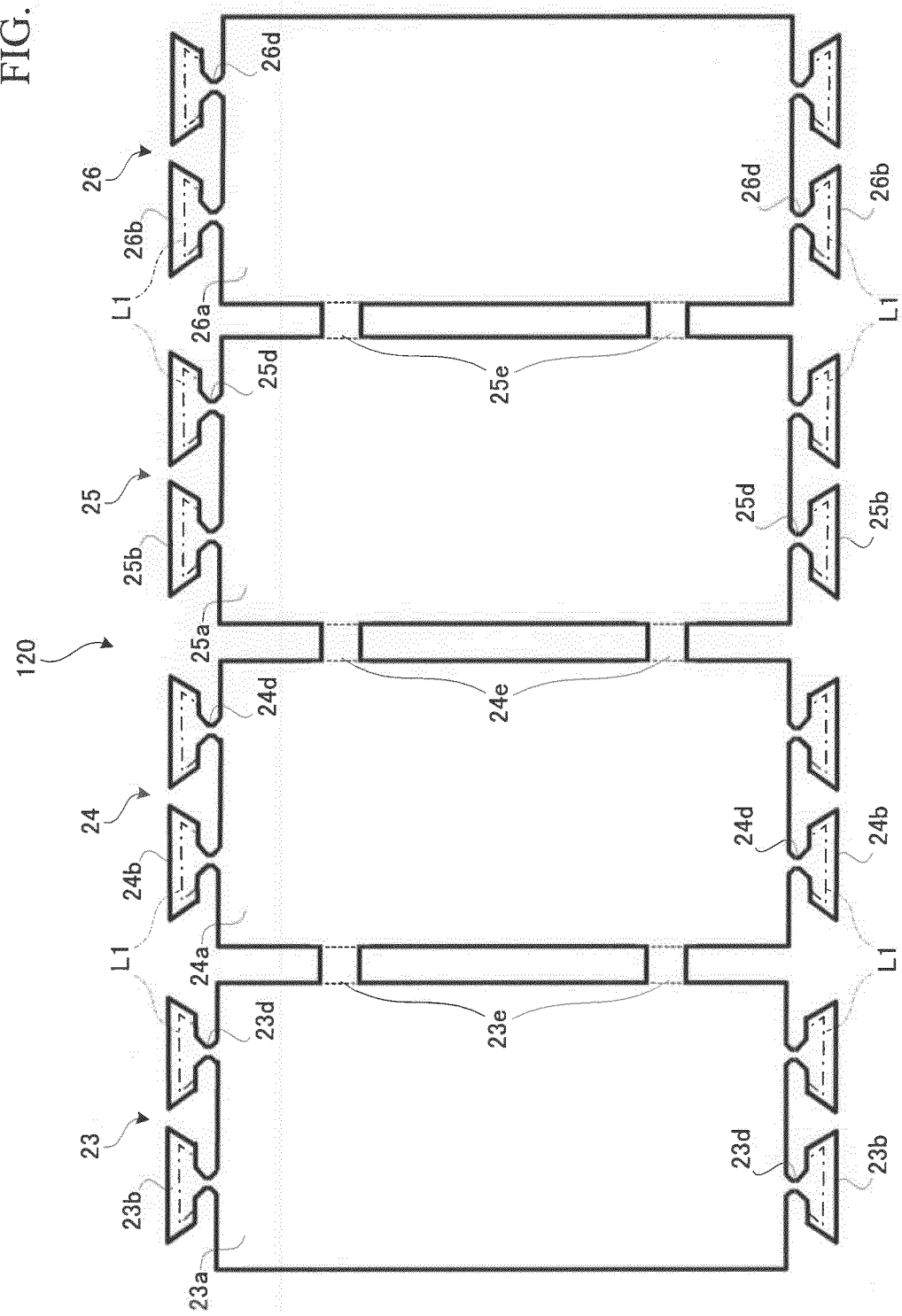
FIG. 28 is a diagram for explaining a step of separating the coupled piece unit from the production panel.

In next step S72, the worker performs outline processing of the coupled piece unit 120 by an ordinary router machine (router without the alignment capability). Accordingly, the coupled piece unit 120 is separated from the production panel 100 as shown in FIG. 28.

The third to sixth parts 23 to 26 which constitute the coupled piece unit 120 fundamentally have the same forms as those of the third embodiment except that the adjoining body parts 23a to 26a are coupled by the lateral coupling portions 23e to 25e. However, the claws 23b to 26b are fitting claws that are fitted in the fitting mates (specifically, claw receiving portions 23c to 26c shown in FIG. 30 to be described later). The claws 23b to 26b are formed in predetermined outside dimensions (design sizes) in the process of step S72.

The lateral coupling portions 23e to 25e are formed in a required quantity (e.g., two at every single coupled portion) at the body parts 23a to 26a. The number of the lateral coupling portions 23e to 25e is optional.

Subsequently, in step S73, the worker uses a checker (electrification test device) on the third to sixth parts 23 to 26, performs an oxidation treatment thereon, and checks the exteriors thereof. In step S74, it is determined whether a defective piece (defect) is present in the third to sixth parts 23 to 26.

When it is determined that the third to sixth parts 23 to 26 are all defect-free pieces (step S74: NO), the flow proceeds to a sequence of steps S74 to S77. That is, the worker connects the third to sixth parts 23 to 26 of the coupled piece unit 120 (first coupled piece unit) to the first and second parts 21 and 22 (first frame part) in steps S75 and S76. The first coupled piece unit is the coupled piece unit that does not contain a defective piece.

Figure 29:
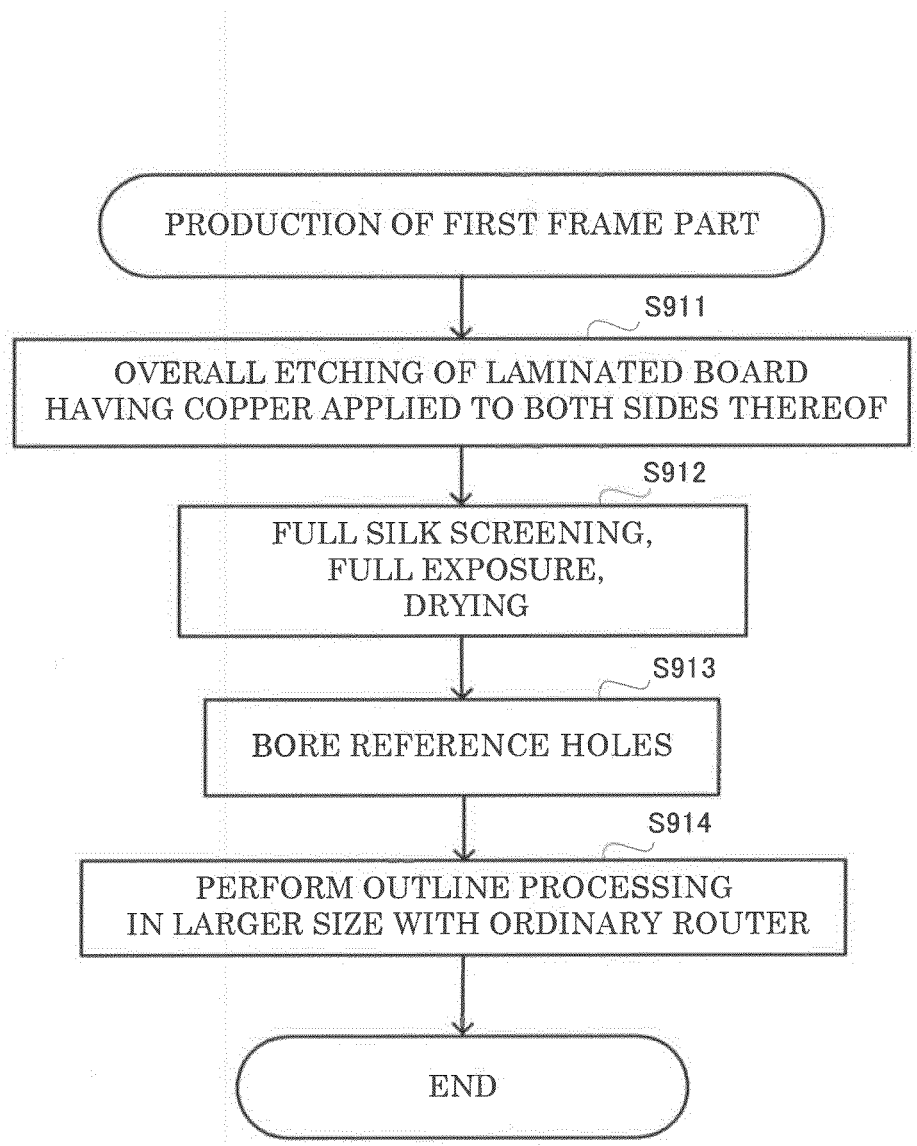
FIG. 29 is a flowchart illustrating procedures of producing a first frame part.

The first frame part is produced separately from the coupled piece unit 120 as the worker, for example, executes a series of processes illustrated in FIG. 29. However, the production of the first frame part is not limited to such a manner; for example, the first frame part may be produced at a production panel common to the coupled piece unit 120.

In the embodiment, first in steps S911 to S913, the worker performs processes similar to those of steps S61 to S63 in FIG. 19 to produce the first and second parts 21 and 22 at a production panel 200 separate from the production panel 100 (FIG. 27) as shown in FIG. 21, followed by overall etching, full silk screening, full exposure, drying and boring of the reference holes 31b.

Figure 30:
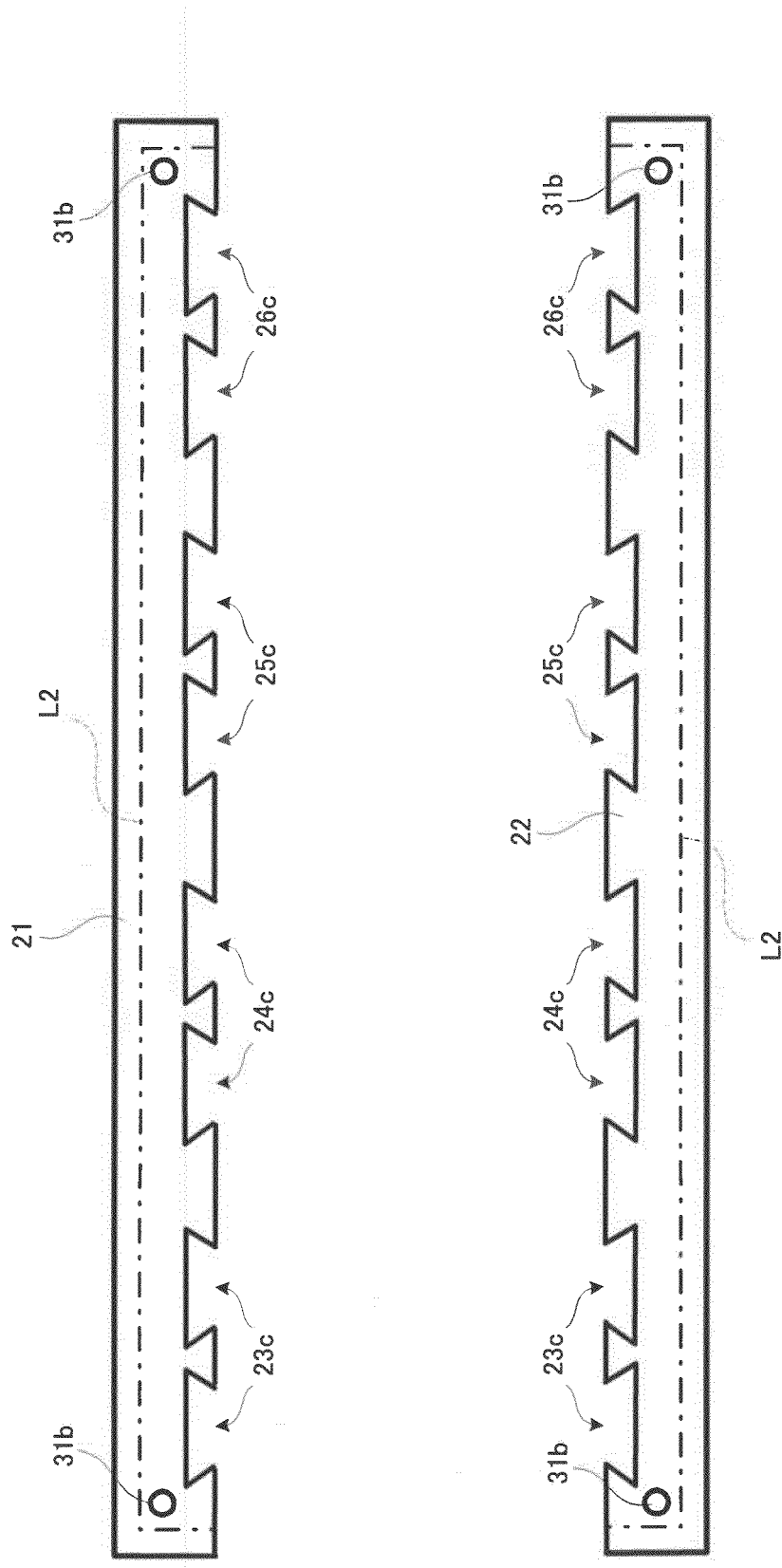
FIG. 30 is a diagram for explaining a step of separating the first frame part from the production panel.
Figure 31:
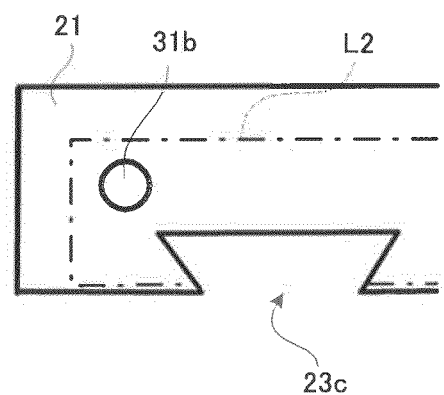
FIG. 31 is a partly enlarged view of FIG. 30.

Subsequently, in step S914, the worker performs outline processing of the first and second parts 21 and 22 by an ordinary router machine as shown in FIG. 30, for example. It is to be noted that at this stage, as shown in FIG. 31 (partly enlarged view of FIG. 30), the first and second parts 21 and 22 are separated in sizes larger than a predetermined outside dimension L2 (design size at the time of product delivery).

The first part 21 and the second part 22 (first frame part) approximately correspond to the frame parts 11a and 11b (FIG. 1), respectively. Basically, the first and second parts 21 and 22 have forms similar to those of the third embodiment. It is to be noted that the claw receiving portions 23c to 26c are fitted over the claws 23b to 26b (claws larger than an outside dimension L1 in FIG. 28) of the coupled piece unit 120.

In step S75 in FIG. 26, the worker sets the pins in the reference holes 31b, and manually fits the claws 23b to 26b of the third to sixth parts 23 to 26 (first coupled piece unit) into the claw receiving portions 23c to 26c of the first and second parts 21 and 22 as shown in, for example, FIG. 32, with the first and second parts 21 and 22 (first frame part) secured to the jig. The fitting of the claws 23b to 26b into the claw receiving portions 23c to 26c causes both to be coupled together by frictional force. Further, for example, a UV (UltraViolet rays) curing adhesive is applied and UV is irradiated in step S76. This reinforces the connected portions between the first and second parts 21 and 22 and the coupled piece unit 120.

In next step S77, the worker performs outline processing of the first and second parts 21 and 22, and the coupled piece unit 120 by, for example, an alignment router. Specifically, as shown in FIG. 33, the outlines of the first and second parts 21 and 22 are shaped into the outside dimension L2, and the lateral coupling portions 23e to 25e are removed to separate the third part 23, the fourth part 24, the fifth part 25 and the sixth part 26 from one another. This completes the multi-piece board 10 as shown in FIG. 1.

Figure 34A:
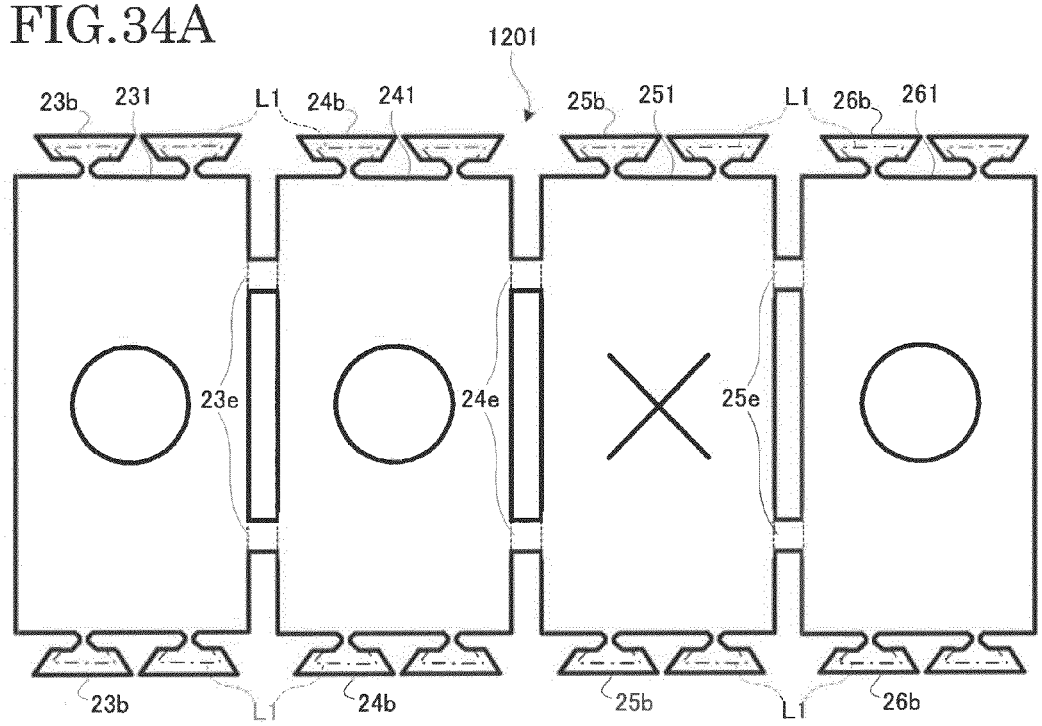
FIG. 34A is a diagram showing a first example of a second coupled piece unit.
Figure 34B:
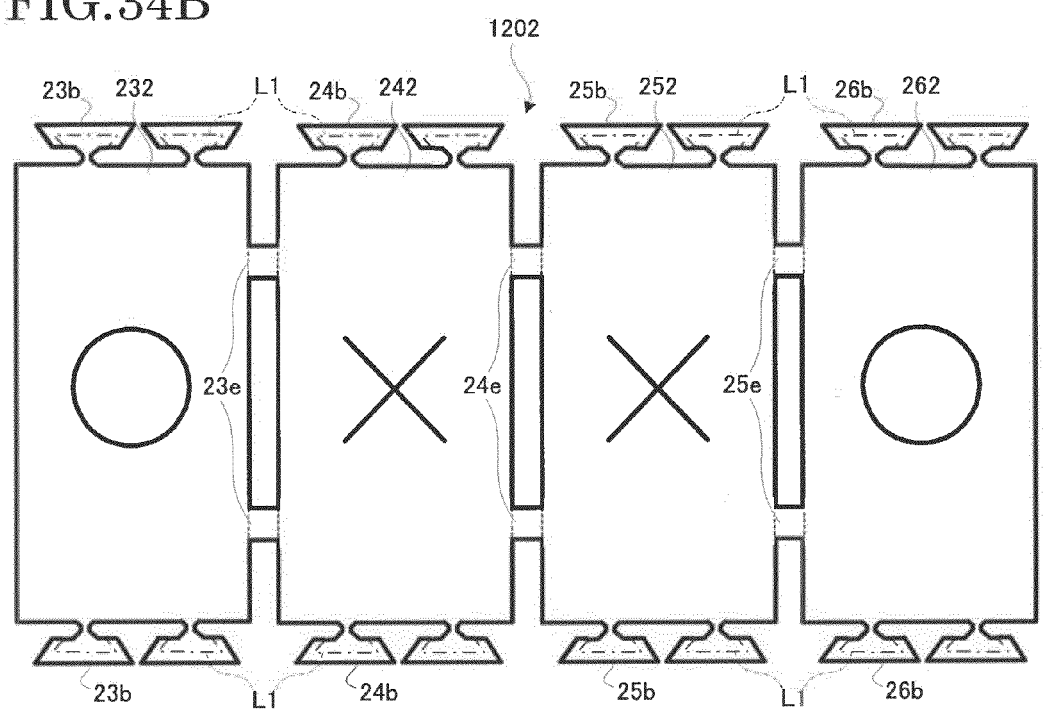
FIG. 34B is a diagram showing a second example of the second coupled piece unit.

When it is determined in step S74 in FIG. 26 that there is a defective piece (step S74: YES), on the other hand, the flow proceeds to a sequence of steps S78 to S80. The following description will be given, by way of example, of a coupled piece unit 1201 (second coupled piece unit) that has a third part 231, fourth part 241 and sixth part 261 which have been determined as defect-free pieces, and a fifth part 251 which has been determined as a defective piece, as shown in FIG. 34A, and a coupled piece unit 1202 (second coupled piece unit) that has a third part 232 and sixth part 262 which have been determined as defect-free pieces, and a fourth part 242 and fifth part 252 which have been determined as defective pieces, as shown in FIG. 34B. The second coupled piece unit is the coupled piece unit that contains a defective piece.

Figure 35A:
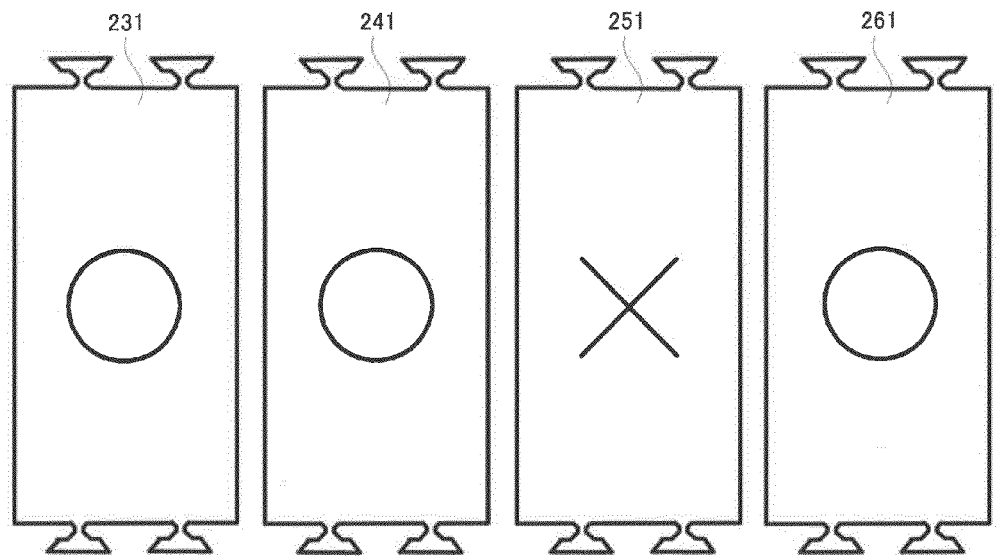
FIG. 35A is a diagram for explaining a step of separating a defect-free piece from the first example of the second coupled piece unit.
Figure 35B:
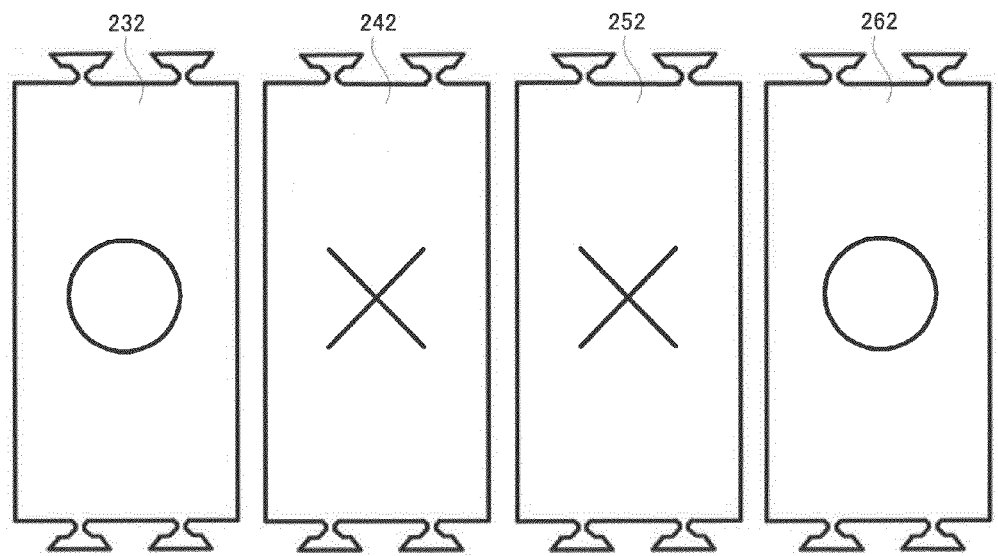
FIG. 35B is a diagram for explaining a step of separating a defect-free piece from the second example of the second coupled piece unit.

In step S78 in FIG. 26, the worker performs outline processing of the coupled piece units 1201 and 1202 by an alignment router. Specifically, as shown in FIGS. 35A and 35B, the outlines of the claws 23b to 26b are shaped into a smaller outside dimension L1 (see FIG. 28), and the lateral coupling portions 23e to 25e are removed to separate the third parts 231 and 232, the fourth parts 241 and 242, the fifth parts 251 and 252, and the sixth parts 261 and 262 from one another. The outline processing of the claws 23b to 26b and the separation of parts may be carried out only for defect-free pieces.

Figure 36:
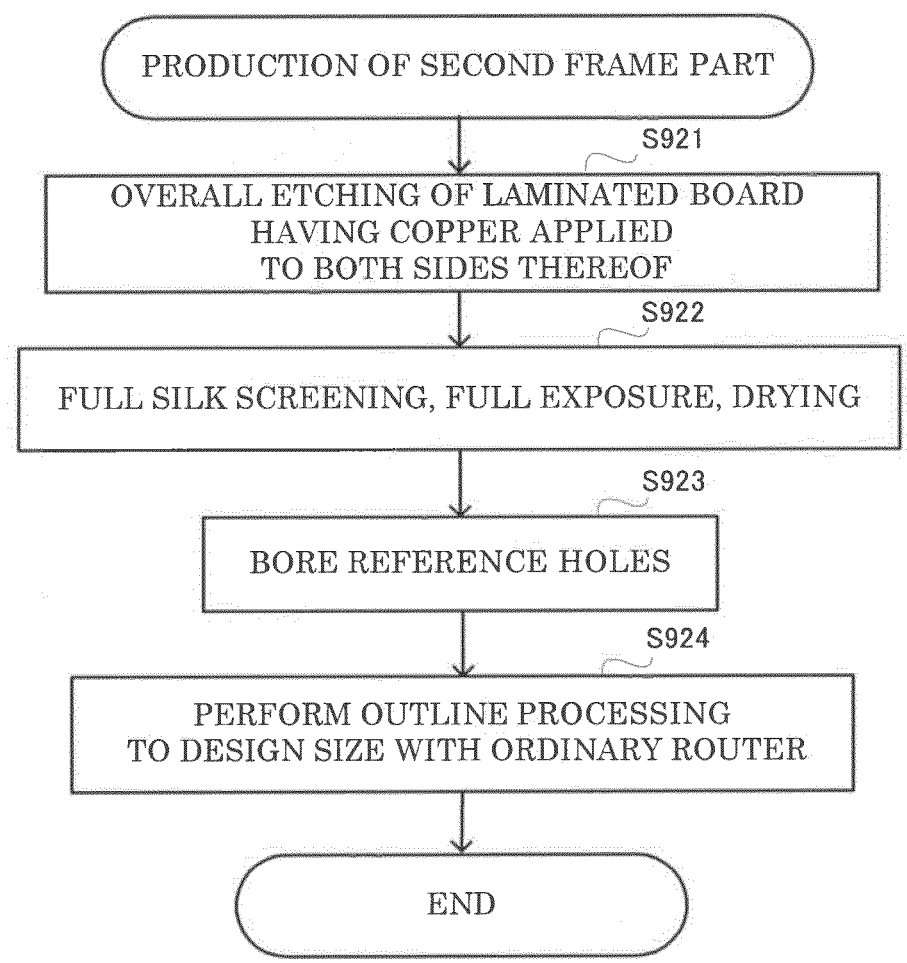
FIG. 36 is a flowchart illustrating procedures of producing a second frame part.

Next, the worker connects the first and second parts 21 and 22 (second frame part) to defect-free pieces of the second coupled piece unit in steps S79 and S80. The second frame part is produced separately from the coupled piece units 1201 and 1202 as the worker, for example, executes a series of processes illustrated in FIG. 36. However, the production of the second frame part is not limited to such a manner; for example, the second frame part may be produced at a production panel common to the second coupled piece unit. Further, the second frame part and the first frame part may be produced at a common production panel together.

In the embodiment, first in steps S921 to S923, the worker performs processes similar to those of steps S61 to S63 in FIG. 19 to produce the first and second parts 21 and 22 at a production panel 200 separate from the production panel 100 (FIG. 27) as shown in FIG. 21, followed by overall etching, full silk screening, full exposure, drying and boring of the reference holes 31b.

Figure 37:
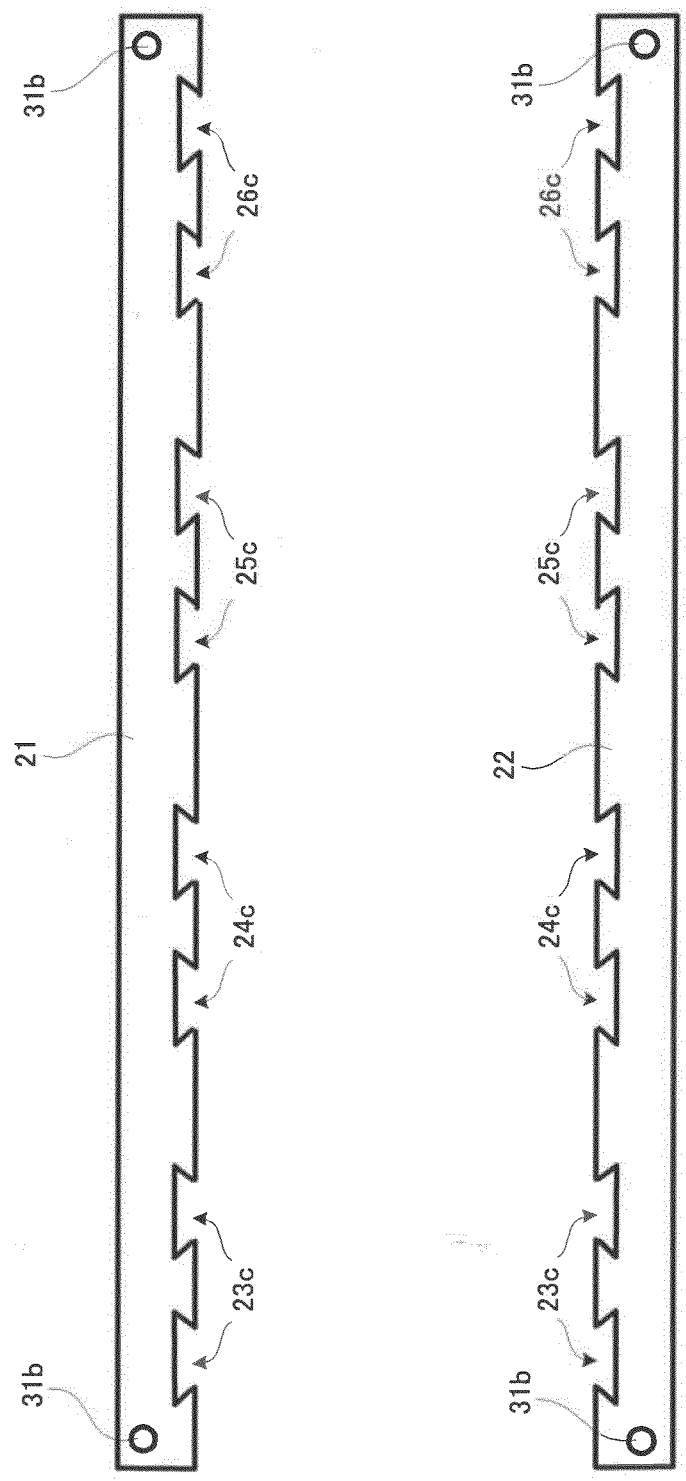
FIG. 37 is a diagram for explaining a step of separating the second frame part from the production panel.

Further, in next step S924, the worker performs outline processing of the first and second parts 21 and 22 by an ordinary router machine as shown in FIG. 37, for example. Accordingly, the first and second parts 21 and 22 are separated in a predetermined outside dimension (design size at the time of product delivery).

The first part 21 and the second part 22 (second frame part) approximately correspond to the frame parts 11a and 11b (FIG. 1), respectively. Basically, the first and second parts 21 and 22 have forms similar to those of the third embodiment. It is to be noted that the claw receiving portions 23c to 26c are fitted over the claws 23b to 26b (claws larger of the outside dimension L1) of the coupled piece units 1201 and 1202.

Figure 38:
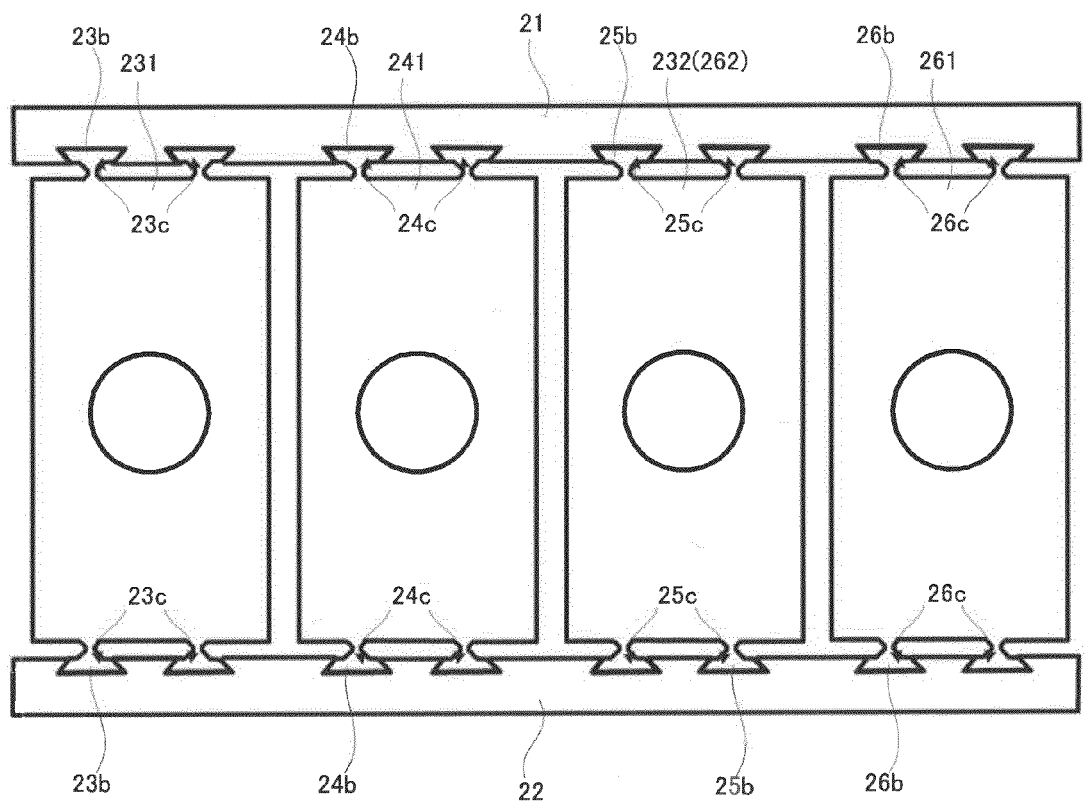
FIG. 38 is a diagram for explaining a step of connecting the second frame part and the second coupled piece unit.

In step S79 in FIG. 26, the worker selects arbitrary four from defect-free pieces contained in the two second coupled piece units, namely the third, fourth and sixth parts 231, 241, 261 (coupled piece unit 1201) and the third and sixth parts 232, 262 (coupled piece unit 1202). Then, the worker sets the pins in the reference holes 31b, and manually fits the claws 23b to 26b of the defect-free pieces into the claw receiving portions 23c to 26c of the first and second parts 21 and 22 as shown in, for example, FIG. 38, with the first and second parts 21 and 22 (second frame part) secured to the jig. The fitting of the claws 23b to 26b into the claw receiving portions 23c to 26c causes both to be coupled together by frictional force. Further, for example, a UV (UltraViolet rays) curing adhesive is applied and UV is irradiated in step S80. This reinforces the connected portions between the second frame part and the defect-free pieces. This completes the multi-piece board 10 as shown in FIG. 1.

According to the fabrication method of the embodiment, first frame parts and second frame parts whose claw receiving portions 23c to 26c have different forms are separately prepared for the first coupled piece unit which does not contain defective pieces, and the second coupled piece unit which contains defective pieces. This makes it possible to carry out outline processing of the claws 23b to 26b (second coupling portions) of the first coupled piece unit and the claws 23b to 26b (second coupling portions) of the second coupled piece unit in different modes. In either case, high reliability can be ensured for the coupling of the frame part to the piece parts.

Specifically, the first coupled piece unit is coupled to the first and second parts 21 and 22 (frame part) with the piece parts coupled together, while the second coupled piece unit is coupled to the first and second parts 21 and 22 (frame part) with the individual piece parts separated. Because the coupling of the piece parts ensures high positional accuracy for the first coupled piece unit, high reliability is obtained in coupling the first coupled piece unit to the frame part even if outline processing of the claws 23b to 26b is carried out quickly with simple cutting means, e.g., an ordinary router. Because the piece parts of the second coupled piece unit are not coupled together, high positional accuracy is not obtained. To ensure high reliability in coupling the second coupled piece unit to the frame part, therefore, the outline processing needs to be carried out with high precision using an alignment router which takes time in processing. According to the fabrication method of the embodiment, therefore, for the second coupled piece unit, the coupled piece unit 120 (FIG. 28) is acquired by an ordinary router after which outline processing of the claws 23b to 26b is further carried out with an alignment router.

Because of the additional outline processing, the claws 23b to 26b of the first coupled piece unit and the claws 23b to 26b of the second coupled piece unit are processed in different forms, so that first frame parts and second frame parts are separately prepared for the first coupled piece unit and the second coupled piece unit according to the fabrication method of the embodiment. That is, in either case, the frame part having the claw receiving portions 23c to 26c which match the forms of the claws 23b to 26b are prepared. This makes it possible to ensure high reliability for the coupling of the frame parts to the piece parts in both cases where the first coupled piece unit is coupled to the first frame part and where defect-free pieces contained in the second coupled piece unit is coupled to the second frame part.

The step of preparing the first frame part and the second frame part includes a case where a complete product is purchased and used besides a case where a personal purchases materials and parts to make the first frame part and the second frame part himself.

The number of yielded products per unit time can be improved by reducing the number of uses of an alignment router or the like which takes time in processing, for example, by not using the alignment router before coupling the first coupled piece unit.

The other processes similar to corresponding processes of the first embodiment of the invention provide effects matching those of the first embodiment.

Although the multi-piece boards and the fabrication methods therefor according to the embodiments of the invention have been described above, the invention is not limited to the embodiments.

(Other Embodiments)

Figure 39:
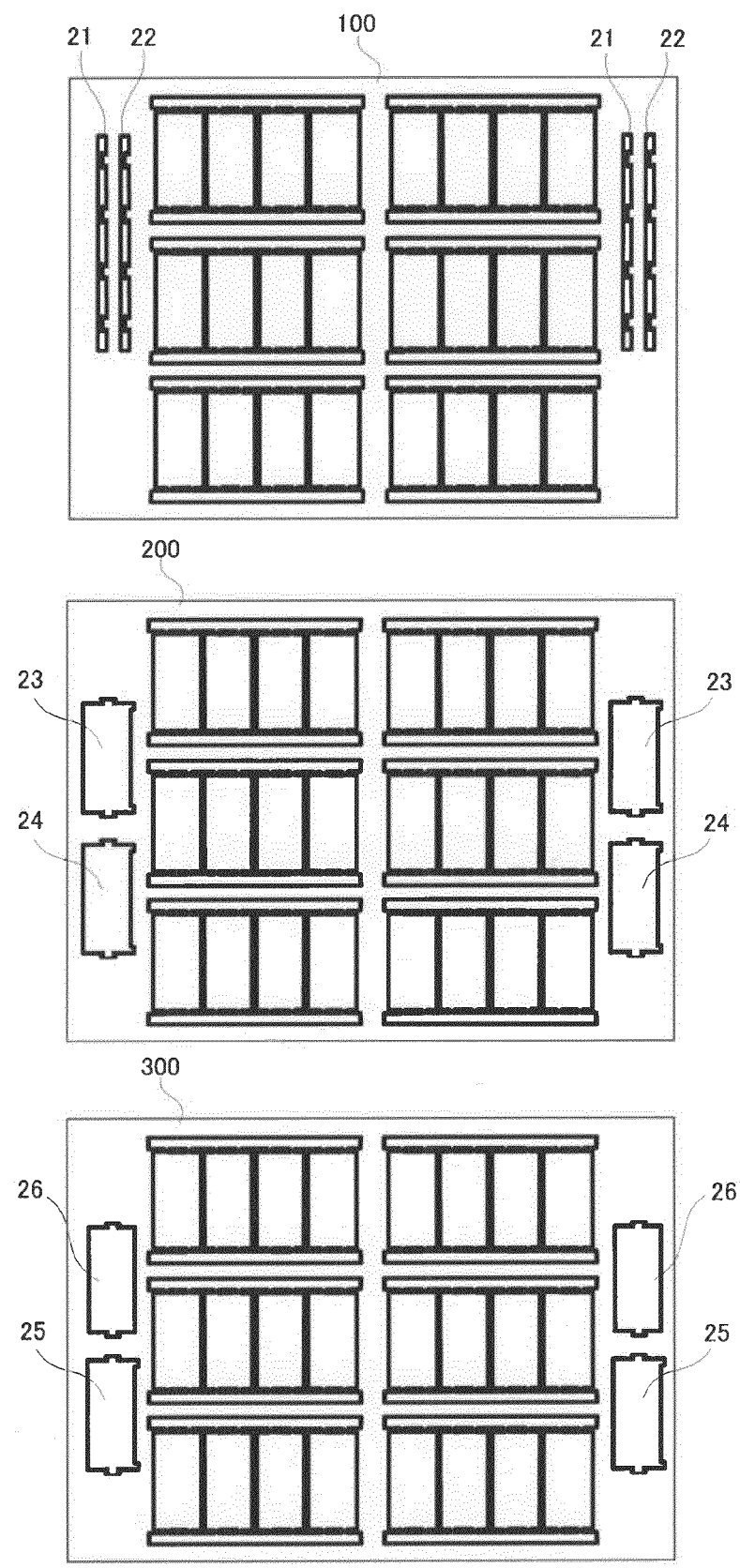
FIG. 39 is a diagram showing an example of fabricating a single multi-piece board from a plurality of workpieces.

Although all the parts of the multi-piece board 10 are produced on a single production panel 100 in the first and second embodiments, the parts may be separately produced on multiple production panels 100, 200 and 300 as shown in FIG. 39, for example, and may be combined later. This facilitates the combination of different types of printed wiring boards.

In the first and second embodiments, the frame parts and piece parts of the multi-piece board 10 are laid out in the free space of the production panel 100 for producing the multi-piece board 50. The invention is not however limited to this configuration; for example, the frame parts and piece parts of the multi-piece board 10 may be laid out in the free space of a production panel for producing a board or the like made of a single piece. It is not essential to produce the frame parts and piece parts of the multi-piece board 10 in the free space of a production panel for producing another board. For example, the frame parts and piece parts of the multi-piece board 10 may be produced on a production panel for producing the multi-piece board 10.

Although outline processing of the parts is carried out in two stages in the first and second embodiments, outline processing of the parts may be carried out in three or more stages. Alternatively, the outline processing may be carried out in one stage by using an alignment router, an ordinary router bit (router without the alignment capability), a laser or the like. Outline processing of only the coupling portions may be carried out in multiple stages.

In the third and fourth embodiments, a UV curing adhesive is used, which is not restrictive, and the type of an adhesive is optional. For example, other non-heat-hardening adhesives may be used. If a severe requirement is not set for a thermal change, for example, a heat-hardening adhesive may be used.

The number of the first to fourth coupling portions (claws and claw receiving portions) is optional. The larger the number of the claws and the number of the claw receiving portions become, the stronger the connection strength (fixation) becomes, which makes the production difficult.

Figure 40A:
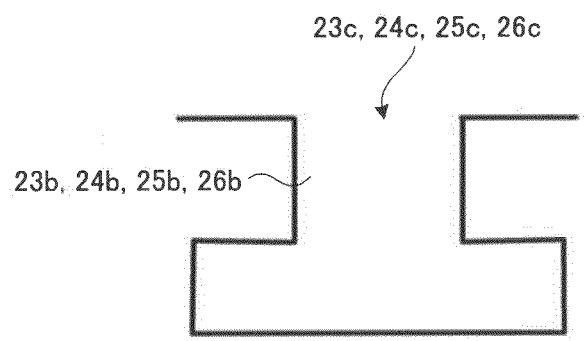
FIG. 40A is a diagram showing another example of the shape of a coupling portion.
Figure 40B:
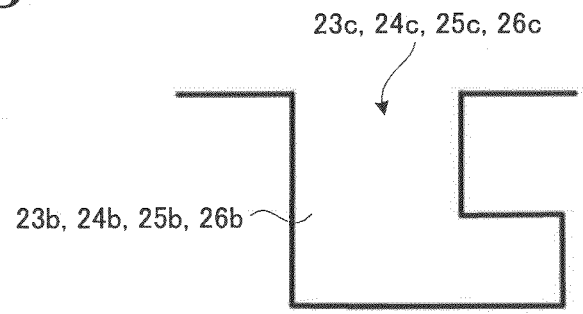
FIG. 40B is a diagram showing a further example of the shape of a coupling portion.
Figure 40C:
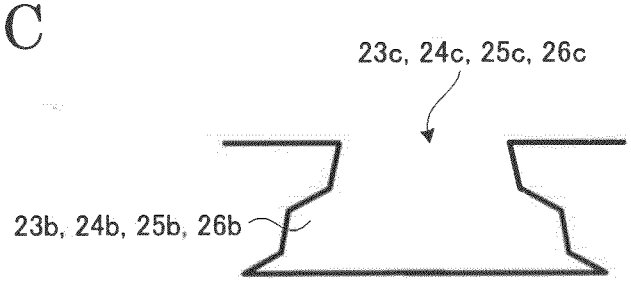
FIG. 40C is a diagram showing a still further example of the shape of a coupling portion.

The shapes of the claws 23b to 26b and the claw receiving portions 23c to 26c are not limited to trapezoidal shapes. As shown in FIG. 40A or FIG. 40B, for example, the claws 23b to 26b may be formed in a T shape or an L shape. To increase the contact areas with the claw receiving portions 23c to 26c, the sides of the claws 23b to 26b may be formed in a zigzag pattern, for example, as shown in FIG. 40C. The shape of the coupling portions is basically optional. It is however preferable that the coupling portion should have such a shape that when one of multiple parts is stretched in parallel to the major surface of the board to firmly connect the parts, the coupling portion is caught at another part so that the one part does not come off the another part.

The sequential order of the processes in the embodiments is not limited to those illustrated in the flowcharts, and can be changed arbitrarily without departing from the scope and spirit of the invention. Unnecessary processes may be omitted according to the usage. For example, the process of checking the degree of flatness may be omitted when severe flatness is not demanded.

The materials and sizes of the individual layers, the number of the layers, and so forth may be changed arbitrarily in the embodiments.

Obviously, numerous modifications and variations of the present invention are possible in light of the above teachings. It is therefore to be understood that within the scope of the appended claims, the invention may be practiced otherwise than as specifically described herein.

What is claimed is:

1. A method for fabricating a multi-piece board, the method comprising:
   providing a production panel comprising a frame having a plurality first coupling portions, and a plurality of piece portions each comprising a printed wiring board and a second coupling portion, the frame and the piece portions being spatially separated from each other on the production panel;
   physically separating the frame and the piece portions from the production panel; and
   combining the frame and the piece portions by coupling each of the first coupling portions of the frame to the second coupling portion of a respective piece portion to form the multi-piece board.

2. The method according to claim 1, wherein said combining comprises fitting one of the first coupling portions to one of the second coupling portions.

3. The method according to claim 1, wherein said combining comprises coupling one of the first coupling portions to one of the second coupling portions by an adhesive filled therebetween.

4. The method according to claim 3, further comprising:
   producing the frame and the piece portions by forming alignment marks on the frame and the piece portions;
   forming positioning holes at predetermined positions on the frame and the piece portions with the alignment marks being references;
   inserting pins in the positioning holes such that the frame and the piece portions are positioned; and
   coupling the first coupling portion and the second coupling portion together by applying the adhesive with the frame and the piece portions being positioned.

5. The method according to claim 1, wherein the plurality of piece portions are produced from at least one coupled piece unit with the piece portions being coupled together.

6. The method according to claim 5, further comprising:
   examining a plurality of said coupled piece units to check whether the piece portions of each coupled piece unit are defect-free or not;
   preparing a first frame having a first coupling portion with a first form;
   preparing a second frame having a first coupling portion with a second form different from the first form;
   separating a defect-free piece from a second coupled piece unit determined as including a defective piece by the examining;
   combining the first coupling portion of the first frame to the second coupling portion of the piece portions formed in a first coupled piece unit determined as not including a defective piece by the examining; and
   combining the first coupling portion of the second frame to the second coupling portion of the separated defect-free piece.

7. The method according to claim 6, further comprising:
   outline processing the first coupled piece unit with a first processing device; and
   outline processing the second coupled piece unit with a second processing device configured to perform processing that is more accurate than the first processing device, wherein the defect-free piece is separated by the second processing device, and said combining the frame and the piece portions comprises:
      coupling the first coupling portion of the first frame to the second coupling portion of the piece portions formed in the first coupled piece unit thus outline processed, and
      coupling the second frame to the first coupling portion of the second frame and to the defect-free piece thus outline processed.

8. The method according to claim 7, wherein the first processing device comprises a router without an alignment capability, and the second processing device comprises a router with an alignment capability.

9. The method according to claim 1, wherein each piece portion comprises a first piece portion having a third coupling portion and a second piece portion having a fourth coupling portion to be coupled to the third coupling portion, and
   wherein the frame and the piece portions are combined by coupling the third coupling portion of the first piece portion and the fourth coupling portion of the second piece portion.

10. The method according to claim 9, further comprising removing a coupled portion of the third coupling portion and the fourth coupling portion.

11. The method according to claim 1, further comprising adhering the frame and the piece portions by an adhesive.

12. The method according to claim 11, wherein said adhering comprises:
    temporarily attaching the frame and the piece portions together by a non-thermosetting heat-hardening adhesive, and
    reinforcing the temporarily-attached portion by a heat-hardening adhesive.

13. The method according to claim 1, further comprising: examining whether the produced piece portion is defect-free or not, wherein said combining comprises combining the frame with piece portions determined as defect-free.

14. The method according to claim 1, wherein outline processing of the piece portions that has been separated from the production panel is carried out in multiple stages.

15. The method according to claim 14, wherein the outline processing is carried out by an alignment router.

16. The method according to claim 1, further comprising outline processing bridges to connect the frame and the piece portions.

17. The method according to claim 1, wherein said combining comprises coupling the first coupling portion of the second frame to the second coupling portion of a respective defect-free piece portion to form the multi-piece board.

18. The method according to claim 1, wherein said providing comprises:
    providing a production panel having a plurality of other multi-piece boards each including another frame and another plurality of piece portions integrally coupled to the another frame on an inner region of the production panel, and
    providing said frame and said piece portions spatially separated from each other on an outer peripheral region of the production panel.

* * * * *